(12) United States Patent
Le Dantec et al.

(10) Patent No.: US 6,370,670 B1
(45) Date of Patent: Apr. 9, 2002

(54) INTERLACER, CODING DEVICE, PERMUTATION METHOD, CODING METHOD, DECODING DEVICE AND METHOD AND SYSTEMS USING THEM

(75) Inventors: Claude Le Dantec, Saint Hilaire des Landes; Philippe Piret, Cesson-Sevigne, both of (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/222,849

(22) Filed: Dec. 30, 1998

(30) Foreign Application Priority Data

Dec. 30, 1997 (FR) .............................. 97 16669
Nov. 9, 1998 (FR) .............................. 98 14084

(51) Int. Cl.$^7$ .................... G06F 11/00; H03M 13/00
(52) U.S. Cl. ................................ 714/781; 714/701
(58) Field of Search .............................. 714/701, 781

(56) References Cited

U.S. PATENT DOCUMENTS

| | | | | |
|---|---|---|---|---|
| 3,988,538 A | * | 10/1976 | Patten ....................... | 380/268 |
| 4,488,302 A | * | 12/1984 | Ahamed ..................... | 714/762 |
| 5,438,590 A | * | 8/1995 | Tzukerman et al. ........ | 375/259 |
| 5,844,989 A | * | 12/1998 | Nishida et al. .............. | 380/28 |
| 5,966,447 A | * | 10/1999 | Nishida et al. .............. | 380/28 |
| 5,978,486 A | * | 11/1999 | Nishida et al. ............. | 380/268 |
| 6,034,996 A | * | 5/2000 | Herzberg .................... | 375/265 |
| 6,151,296 A | * | 11/2000 | Vijayan et al. ............. | 370/208 |

OTHER PUBLICATIONS

Wicker (Stephen B. Wicker, "Error Control Systems", Prentice Hall, 1995).*

S. Benedetto, D. Divsalar, G. Montorsi, and F. Pollara, "Soft–Output Decoding Algorithms in Iterative Decoding of Turbo Codes", NASA, JPL, TDA Progress Report 42–124, Feb. 15, 1996.*

D. Divsalar, and F. Pollara "On the Desing of Turbo Codes", NASA, JPL, TDA Progress Report 42–123, Nov. 15, 1995.*

D. Divsalar, and F. Pollara "Hybrid Concatenated Codes and Iterative Decoding", NASA, JPL, TDA Progress Report 42–130, August 15, 1997.*

Danny T. Chi "A New Block Helical Interleaver", IEEE, 1992.*

Claude Berrou and Alain Glavieux, "Near Optimum Error Correcting Coding and Decoding: Turbo–Codes", IEEE Transactions on Communications, vol. 44, No. 10, October 1996.*

A. S. Barbulescu and S. S. Pietrobon, "Terminating the Trellis of Turbo–codes in the Same State", Electronic Letters, vol. 31, No. 1, Jan. 5, 1995.*

E. Dunscombe and F. C. Piper, "Optimal Interleaving Scheme for Convolutional Codes", Electronic Letters, vol. 25, No. 22, October 26, 1989.*

A. S. Barbulescu and S. S. Pietrobon, "Interleaver Design for Turbo Codes", Electronic Letters, vol. 30, No. 25, Dec. 8, 1994.*

(List continued on next page.)

*Primary Examiner*—Albert Decady
*Assistant Examiner*—Joseph D. Torres
(74) *Attorney, Agent, or Firm*—Fitzpatrick, Cella, Harper & Scinto

(57) ABSTRACT

A coding method for padding K information sequences $\underline{u}_i$ (i=1, 2, . . . , K) to produce K+M1 binary sequences $\underline{a}_i$ (i=1, 2, . . . , K) and $c_i$ (i=1, 2, . . . , M1) so that the sequences $\underline{a}_i$ are divisible by a set of K predetermined generator polynomials $g_i(x)$ (i=1, 2, . . . , K) each dividing $(X^{N0}+1)$ and the M1 sequences $c_i$ are obtained in a calculation involving permutations of the sequences $\underline{a}_i$ (i=1, 2, . . . , K); the permutations having the property of transforming a cyclic code of length N0 with generator polynomial $g_i(x)$ to an equivalent cyclic code with a predetermined generator polynomial $g_{ij}(x)$.

22 Claims, 9 Drawing Sheets

OTHER PUBLICATIONS

Danny T. Chi "A New Algorithm for Error Correcting Single Burst Errors With Reed–Soloman Code", IEEE, 1991.*

Berrou Et Al.: "Near Optimum error correcting coding and decoding ; turbo codes", IEEE Transactions on Communications, vol. 44, No. 10, Oct., 1996, pp. 1261–1271, XP000629465, IEEE Transactions on Communications paragraphs Uniform interleaving et "Nonuniform interleaving".

Divsalar Et Al.: "Turbo codes for PCS applications", Proceedings of the Int'l Conference on Communications, vol. 1, Jun. 18–22, 1995, pp. 54–59, XP000532968, Seattle, US, paragraph "Interleaver design".

Barbulescu Et Al.: "Interleaver design for turbo codes", Electronics Letters, vol. 30, No. 25, Dec. 8, 1995, pp. 2107–2108, XP000501850, Stevenage, Herts, GB.

Berrou Et Al.: "Frame oriented convolutional turbo codes", Electronics Letters, vol. 32, No. 15, Jul. 18, 1996, pp. 1362–1364, XP000625424, Stevenage, Herts, GB.

* cited by examiner

INTERLACER, CODING DEVICE, PERMUTATION METHOD, CODING METHOD, DECODING DEVICE AND METHOD AND SYSTEMS USING THEM

The present invention concerns a coding device, a coding method, a decoding device and method and systems implementing them.

It applies just as well to the coding of data representing a physical quantity, to the coding of data in the form of codes able to modulate a physical quantity, to the decoding of data modulated signals, and to the decoding of data representing a physical quantity. These data can for example represent images, sounds, computer data, electrical quantities or stored data.

The invention finds an application in the field of convolutional codes. When the latter are used to implement an iterative decoding, these codes are greatly improved when their coders contain a permutation device. In this case, they are normally referred to as "turbocodes" and the corresponding iterative decoder is referred to as a "turbodecoder".

On these subjects, documents which serve as a reference are, on the one hand, the article by Messrs. C. BERROU, A. GLAVIEUX and P. THITIMAJSHIMA entitled "Near Shannon limit error-correcting coding and decoding: turbocodes" published with the reports of the conference "ICC'93", 1993, pages 1064 a 1070, and, on the other hand, the article by Messrs. C. BERROU and A. GLAVIEUX entitled "Near Optimum error-correcting coding and decoding: turbocodes" published by IEEE Transactions on Communication, Volume COM-44, pages 1261 to 1271, in October 1996.

However, the formation of permutation devices is far from being perfectly mastered. In general this device uses square or rectangular matrices in which one row after another is written and one column after another is read. These matrices are generally very large, for example of a size 256×256.

According to another method, in an article entitled "Weight distributions for turbo-codes using random and nonrandom permutations" published by Jet Propulsion Laboratory, with "TDA Progress Report", number 42–122, of Aug. 15, 1995, Messrs. DOLINAR and DIVSALAR considered the permutations which, by numbering the k information positions between 0 and k−1, move the binary information placed at a position i to a position e i+f, for "well chosen" values of e and f.

In this document, they give only one example where k is a power of 2. In addition, they do not discuss the possible reciprocal influence of the choice of the permutation device and of that of the elementary convolutional coders (2, 1) to be used to generate the coded sequences produced by the turbocoder (3, 1).

The evaluation of the corresponding turbocode consists of simulating its use on a transmission channel with different signal/noise ratio values and measuring the minimum value of this ratio for which a predetermined value of the probability of error on the binary values is reached.

However, the use of simulations as an evaluation tool can lead to a few problems.

For example, the permutation device with k=65536= 256×256, mentioned above, is chosen, and a predetermined error probability equal to $10^{-5}$ is chosen to simulate the performance of a turbocode using this device. Consequently the mean number of errors on the binary values per block of 256×256 will be close to 1, but it will not be known whether each binary information item has the same error probability. This error probability could be fairly high for binary values having an "unlucky" position in the permutation device and this probability could be much smaller for more "lucky" positions.

A possible method for remedying this situation is to produce a harmonious and conjoint design of the permutation device and the two convolutional coders in order to guarantee a reasonable uniformity of the error rate on the binary values after decoding, as a function of the position of the binary information in the permutation device.

Another problem concerns the lack of algebraic tools for specifying the permutation devices. It will be useful to have available means for specifying a selection of permutation devices having a performance representative of the set of all the permutation devices.

The invention concerns principally the transmission of information represented by sequences of binary symbols:

$$u=(u_0, u_1, \ldots, u_{k-1}),$$

referred to as "sequences of information", which will be coded in a triplet of binary sequences, $$\underline{v}=(a, b, c),$$

each of these sequences a, b and c, being, by itself, representative of the sequence u.

In the remainder of the description, in order to represent a sequence u, the form $u=(u_0, u_1, \ldots, u_{k-1})$, is used indifferently along with the associated polynomial form:

$$u(x)=u_0 x^0+u_1 x^1+\ldots+u_{k-1} x^{k-1}.$$

Equivalent notations will be used for the sequences a, b and c. Using this second representation, its is known, in order to determine the triplet $\underline{v}=(a, b, c)$:

to choose $a(x)=u(x)$;

to choose $b(x)=u(x).h_1(x)/g(x)$, where $g(x)$ is the polynomial, for example $g(x)=1+x+x^3$, corresponding, according to the representation in a sequence, to the sequence (1, 1, 0, 1); and $h_1(x)$ is a polynomial, for example $h_1(x)=1+x+x^2+x^3$, corresponding to the sequence (1, 1, 1, 1); and by calling $\underline{a}^*$ a sequence formed by permutation of the binary data of the sequence a, to choose $c(x)=a^*(x).h_2(x)/g(x)$ where $h_2(x)$ is a polynomial, for example $h_2(x)=(1+x^2+x^3)$ corresponding to the sequence (1, 0, 1, 1).

Any choice of the polynomials $g(x)$, $h_1(x)$, $h_2(x)$ and of the permutation specifying the interlacer which associates the permuted sequence $\underline{a}^*$ with the sequence a, specifies a coder which will be referred to as a "turbocoder". All the sequences which a specified turbocoder can produce will be referred to as "turbocode".

In the remainder of the description, the term "first coder", will be given to the elementary recursive convolutional coder which produces the sequence b and "second coder" will be given to the one which produces the sequences c.

The polynomial divisions used are of the type consisting of division according to ascending powers, well known to persons skilled in the art. They use modulo 2 arithmetic. The sequences a, b and c are binary sequences and in the general case the divisions which define b and c have a remainder.

This type of coding method has the advantage of lending itself to an iterative decoding which is powerful, relatively simple and inexpensive.

To implement it, several questions are posed.

I/ How to choose the polynomials $g(x)$, $h_1(x)$ et $h_2(x)$?

II/ How to choose the permutation of the terms of the sequence a which produces the sequence a*? Amongst the choices proposed, three examples of interlacers, that is to say of operators which permute the terms of the sequence a*, in order to form the sequence a*, are given below;

A) in the first example, after having arranged the terms of a in a rectangular table, successively row by row and, for each row, from left to right, the sequence a* is formed by taking the terms in this table in succession column after column and, for each column, from top to bottom. For example, in the case of sequences of six terms and the use of a table of two rows of three columns, the interlacer transforms the sequence a=($a_0$, $a_1$, $a_2$, $a_3$, $a_4$, $a_5$) into the sequence a*=($a_0$, $a_3$, $a_1$, $a_4$, $a_2$, $a_5$).

B) in a second example, the i-th term (i=0, 1, 2, . . . ) $a^*_i$ of the sequence a* is chosen as being the term $a_j$ of the sequence a, with j=s.i+t calculated modulo the number of terms in the sequence a, s and t being integers. For example, if the number of terms of the sequence a is six and if s=5 and t=3, the interlacer transforms the sequence, a=($a_0$, $a_1$, $a_2$, $a_3$, $a_4$, $a_5$) into the sequence a*=($a_3$, $a_2$, $a_1$, $a_0$, $a_5$, $a_4$).

C) in the third example, the permutation chosen is random.

III/ How to avoid the division defining b(x) not having a remainder? and

IV/ How to avoid the division defining c(x) having a remainder?

Responding to these last two questions amounts to resolving a problem frequently mentioned in the literature on turbocodes, which is that of the "return to the zero state" of the elementary convolutional coders defining b and c. Since the turbocoders have two elementary recursive coders, the second of which uses a permutation a* of the sequence a, it is wished to guarantee that the polynomials a(f) and a*(x) representing the information sequence u(x) are simultaneously divisible by g(x). Ensuring this divisibility condition for a(x) is simple since it suffices to construct a(x) from u(x) whilst supplementing u(x) with padding symbols in a number equal to the degree of g(x) and whose only function is to guarantee the absence of a remainder in the division serving to produce b(x) from a(x).

Choosing a permutation producing a*(x) from a(x) which guarantees both the divisibility of a*(x) by g(x) and good error correction performances for the turbocode thus specified is, on the other hand, more difficult.

This problem can give rise to disparities between the probabilities of errors after decoding of the different bits constituting u(x).

In an article which appeared in volume 31 No 1 of the journal *"Electronics Letters"* of Jan. 5, 1995, Messrs. BARBULESCU and PIETROBON disclosed that an interlacer can be described by successively and cyclically arranging the terms of the sequence a in a number of sequences equal to the degree of the polynomial g(x) incremented by one, and that, in such case, permutations internal to each of the sequences thus formed give rise to equality between remainder of the division defining the sequence b and that of the division defining the sequence c.

However, and contrary to what is stated in this article, this statement is true only if the polynomial g(x) is of the form $\Sigma_{i=0 \, to \, m} x^i$.

In an article entitled "Turbo-block-codes", published with the reports of the seminar "Turbo Coding" organised by the Institute of Technology of Lund (Sweden) (Department of Applied Electronics) in August 1996, Messrs C. BERROU, S. EVANO and G. BATTAIL disclosed that, by arranging the terms of the sequence u, cyclically, in a number of columns equal to a multiple of the degree N0 of the polynomial of type $x^n-1$ of the lowest strictly positive degree which is divisible by g(x), permutations internal to each of the columns thus formed mean that the sum of the remainder of the division defining the sequence b and of that of the division defining the sequence c is nil, so that the concatenation of the sequences is divisible by g.

This document, just like the previous one, therefore restricts the choice of the interlacers to particular forms working independently on sub-sets of the terms of the sequence a by applying internal permutations to them. It does not however guarantee that individually a(x) and a*(x) are divisible by g(x). The only thing that is guaranteed is the divisibility by g(x) of the polynomial representing the concatenation (a, a*), consisting of putting the two sequences a and a* end to end.

There results a possible loss of efficacy of the decoder since the latter is not informed of the state which the coder had at the moment marking the end of the calculation of b and the start of the calculation of c.

None of the articles cited proposes an effective choice of interlacer.

The present invention sets out to remedy these drawbacks by proposing on the one hand families of interlacers which guarantee return to zero at the end of the sequence c, when the sequence b returns to zero, and on the other hand proposing a choice of interlacers which is wider than that proposed by the articles cited above.

To this end, according to a first aspect, the present invention relates to a coding method characterised in that:

1/ it takes into account:
   a predetermined integer M1, equal to or greater than 2,
   a number K, greater than or equal to 1, of sequences $a_1$ (i=1, . . . , K) of binary data representing a physical quantity, each sequence $a_i$ having:
      a polynomial representation $a_i(x)$ which is a multiple of a predetermined polynomial $g_i(x)$, and
      a number of binary data equal to the product of any integer number M and the integer N0, the smallest integer such that the polynomial $x^{N0}+1$ is divisible by each of the polynomials $g_1(x)$;

2/ it includes a first operation of producing a number K*M1 of so-called "permuted" sequences $a_{ij}^*$, (i=1, . . . , K; j=1, . . . , M1), each sequence $a_{ij}^*$
   being obtained by a permutation of the corresponding sequence $a_i$, said permutation being, in a representation where the binary data of each sequence $a_i$ are written, row by row, in a table with N0 columns and M rows, the resultant of any number of so-called elementary permutations which, each:
      either has the property of transforming the cyclic code of length N0 and with a generator polynomial $g_1(x)$ into an equivalent cyclic code with a generator polynomial $g_{1j}(x)$ which can be equal to $g_i(x)$, and acts by permutation on the N0 columns of the table representing $a_i$,
      or is any permutation of the symbols of a column of said table; and
   having, in consequence, a polynomial representation $_{ij}(x)$ which is equal to a polynomial product $c_{ij}(x)g_{ij}(x)$,
   at least one permuted sequence $a_{ij}^*$ being different from the corresponding sequence $a_{ij}$, 3/ it includes a second operation of producing M1 redundant sequences whose polynomial representation is equal to $\Sigma f_{ij}(x) c_{ij}(x)$, for $j=1, \ldots, M1$, each polynomial $f_{ij}(x)$ being a polynomial with a degree at most equal to the degree of the polynomial $g_{ij}(x)$ with the same indices i and j.

There have been introduced above, in a representation where the binary data of the sequence a are classified in a table of N0 columns and M rows, the successions of permutations taken from all the permutations including, on the one hand, the automorphisms of the binary cyclic code of length N0 and with a generator polynomial g(x), permuting with each other at least two of the N0 columns of the table and, on the other hand, the permutations working solely on data in the same column and permuting with each other at least two of the said data.

The inventors have discovered that all these successions of permutations, and only these, guarantee that, for any polynomial a(x) whose division by g(x) leaves a nil remainder, the permuted polynomial a*(x) has the same property.

For the study of the conditions governing the choice of $g_{ij}$, the reader can refer to page 234 of the book by Mrs F. J. MACWILLIAMS and Mr N. J. A. SLOANE "The theory of error-correcting codes" published by North-Holland in 1977 and whose seventh impression was printed in 1992).

All choices described in the present invention include the interlacers disclosed in the two articles mentioned above. Thus the performance expressed in terms of error rate as a function of the signal/noise ratio can be improved without increasing the complexity of the turobcoder or that of the turbodecoder.

According to a second aspect, the present invention relates to a coding method characterised in that:

1/ it takes into account:
   a predetermined integer M1, equal to or greater than 2,
   a number K, greater than or equal to 1, of sequences $a_i(i=1, \ldots, K)$ of binary data representing a physical quantity, each sequence $a_i$ having:
      a polynomial representation $a_i(x)$ which is a multiple of
         a predetermined polynomial $g_i(x)$ and has no multiple polynomial factors, and
      a number of binary data equal to the product of any odd integer number M and the integer N0, the smallest integer such that the polynomial $x^{N0}+1$ is divisible by each of the polynomials $g_i(x)$;

2/ it includes a first operation of producing a number K*M1 of so-called "permuted" sequences $a_{ij}^*$, (i=1, ..., K; j=1, ..., M1), each sequence $a_{ij}^*$ having a polynomial representation equal to $a_{ij}^*(x)=a_i^*(x^{eij})$ modulo $(x^n+1)$, where
   n is the product of the number M and the integer N0,
   $e_{ij}$ is a relatively prime number with n
   $c_{ij}$ is the quotient of $a_{ij}^*(x)$ by $g_{ij}(x)$,
   the polynomial $g_{ij}(x)$ is the generator polynomial of the smallest cyclic code of length N0 containing the polynomial $g_i(x^{eij})$ modulo $(x^{N0}+1)$,
   at least one permuted sequence $a_{ij}^*$ being different from the corresponding sequence $a_i$;

3/ it includes a second operation of producing M1 redundant sequences whose polynomial representation is equal to $\Sigma f_{ij}(x) c_{ij}(x)$, for $j=1, \ldots, M1$ each polynomial $f_{ij}(x)$ being a predetermined polynomial with a degree at least equal to the degree of the polynomial $g_{ij}(x)$ with the same indices i and j.

It should be noted here that it is then stated that e belongs to the cycle of 2, modulo M.N0.

By virtue of these provisions, on the one hand the majority of the columns in the table can be moved by permutation, and on the other hand, in this restricted choice, the minimum distance of the turbocode is more easily analysable and can therefore be optimised.

This second aspect of the invention has the same advantages as the first aspect.

The inventors observed that implementing the method of the present invention, in each of its aspects, as disclosed above, has the advantage that any error estimation by the corresponding decoder converges. The case where the error estimation does not converge is therefore excluded by the implementation of the present invention.

According to particular characteristics, during the first production operation, all the values of the exponents $e_{ij}$ having same value of the index j are identical.

By virtue of these provisions, the coding method to which the present invention relates makes it possible to effect all the interlacings to j fixed in the same way. It is therefore simple to implement.

According to particular characteristics, during the first production operation, all the values of the exponents $e_{ij}$ are equal to a power of 2.

By virtue of this provision, the polynomials $g_{ij}$ are all identical.

According to particular characteristics, the coding method to which the present invention relates, as briefly disclosed above, includes an operation of transmitting on the one hand sequences $\underline{a}_i$, and, on the other hand, a sub-set of the data of the other sequences.

By virtue of these provisions, the efficiency of the method is increased.

According to a third aspect, the present invention relates to a coding device characterised in that it includes a processing means adapted to:

1/ take into account:
   a predetermined integer M1, equal to or greater than 2,
   a number K, greater than or equal to 1, of sequences $a_i(j=1, \ldots, K)$ of binary data representing a physical quantity, each sequence $a_i$ having:
      a polynomial representation $a_i(x)$ which is a multiple of
         a predetermined polynomial $g_i(x)$, and
      a number of binary data equal to the product of any integer number M and the integer N0, the smallest integer such that the polynomial $x^{N0}+1$ is divisible by each of the polynomials $g_i(x)$;

2/ production of a number K*M1 of so-called "permuted" sequences, $a_{ij}^*$, (i=1, ..., K; j=1, ..., M1), each sequence $a_{ij}^*$
   being obtained by a permutation of the corresponding sequence, said permutation being, in a representation where the binary data of each sequence $a_i$ are written, row by row, in a table with N0 columns and M rows, the resultant of any number of so-called elementary permutations which, each:
      either has the property of transforming the cyclic code of length N0 and with a generator polynomial $g_1(x)$ into an equivalent cyclic code with a generator polynomial $g_{ij}(x)$ which can be equal to $g_i(x)$, and acts by permutation on the N0 columns of the table representing $a_i$,
      or is any permutation of the symbols of a column of said table; and
   having, in consequence, a polynomial representation $a_{ij}^*$ (x) which is equal to a polynomial product $c_{ij}(x)g_{ij}(x)$,
   at least one permuted sequence $a_{ij}^*$ being different from the corresponding sequence $a_i$, 3/ producing M1 redundant sequences whose polynomial representation is equal to $\Sigma f_{ij}(x) c_{ij}(x)$, for $j=1, \ldots, M1$, each polynomial $f_{ij}(x)$ being a polynomial with a degree at least equal to the degree of the polynomial $g_{ij}(x)$ with the same indices i and j.

According to a fourth aspect, the present invention relates to a coding device characterised in that it has a processing means adapted to:

1/ take into account:
a predetermined integer M1, equal to or greater than 2,
a number K, greater than or equal to 1, of sequences $a_i$ (j=1, . . . , K) of binary data representing a physical quantity, each sequence $a_i$ having,
a polynomial representation $a_i(x)$ which is a multiple of a predetermined polynomial $g_i(x)$ and has no multiple polynomial factors, and
a number of binary data equal to the product of any odd integer number M and the integer N0, the smallest integer such that the polynomial $x^{N0}+1$ is divisible by each of the polynomials $g_i(x)$;

2/ produce a number K*M1 of so-called "permuted" sequences $a_{ij}^*$, (j=1, . . . , K; j=1, . . . , M1), each sequence $a_{ij}^*$ having a polynomial representation equal to $a_{ij}^*(x)=a_i^*(x^{e_{ij}})$ modulo $(x^n+1)$, where
n is the product of the number M and the integer N0,
$e_{ij}$ is a relatively prime number with n
$c_{ij}$ is the quotient of $a_{ij}^*(x)$ by $g_{ij}(x)$,
the polynomial $g_{ij}(x)$ is the generator polynomial of the smallest cyclic code of length N0 containing the polynomial $g_i(x^{e_{ij}})$ modulo $(x^{N0}+1)$,
at least one permuted sequence $a_{ij}^*$ being different from the corresponding sequence $a_j$;

3/ produce M1 redundant sequences whose polynomial representation is equal to $\Sigma f_{ij}(x) c_{ij}(x)$, for j=1, . . . , M1, each polynomial $f_{ij}(x)$ being a predetermined polynomial with a degree at least equal to the degree of the polynomial $g_{ij}(x)$ with the same indices i and j.

According to a fifth aspect, the present invention relates to a decoding method characterised in that:

1/ it takes into account:
a predetermined integer M1, equal to or greater than 2,
a number K, greater than or equal to 1, of sequences $a_i$ (j=1, . . . , K) of binary data representing a physical quantity, each sequence $a_j$ having:
a polynomial representation $a_i(x)$ which is a multiple of a predetermined polynomial $g_i(x)$, and
a number of binary data equal to the product of any integer number M and the integer N0, the smallest integer such that the polynomial $x^{N0}+1$ is divisible by each of the polynomials $g_i(x)$;

2/ it includes an operation of parallel turbodecoding of K sequences of symbols using the divisor polynomials $g_{ij}(x)$.

3/ it includes, for each $a_j$, M1 permutation operations at least one of which is not identity, each permutation being, in a representation where the binary data of each sequence $a_j$ are written, row by row, in a table with N0 columns and M rows, the resultant of any number of so-called elementary permutations which, each:
either has the property of transforming the cyclic code of length N0 and with a generator polynomial $g_i(x)$ into an equivalent cyclic code with a generator polynomial $g_{ij}(x)$ which can be equal to $g_i(x)$, and acts by permutation on the N0 columns of the table representing $a_j$,
or is any permutation of the symbols of a column of said table.

According to a sixth aspect, the present invention relates to a decoding method characterised in that:

1/ it takes into account:
a predetermined integer M1, equal to or greater than 2,
a number K, greater than or equal to 1, of sequences $a_i$ (j=1, . . . , K) of binary data representing a physical quantity, each sequence $a_i$ having:
a polynomial representation $a_i(x)$ which is a multiple of a predetermined polynomial $g_i(x)$ and which has no multiple polynomial factors, and
a number of binary data equal to the product of any odd integer number M and the integer N0, the smallest integer such that the polynomial $x^{N0}+1$ is divisible by each of the polynomials $g_i(x)$;

2/ it includes an operation of parallel turbodecoding of K sequences of symbols using the divisor polynomials $g_{ij}(x)$, 3/ the said parallel turbodecoding operation including a permutation operation producing so-called "permuted" sequences, $a_{ij}^*$, (i=1, . . . , K; j=1, . . . , M1), each permuted sequence $a_{ij}^*$ having a polynomial representation equal to $a_{ij}^*(x)=a_i^*(x^{e_{ij}})$ modulo $(x^n+1)$, where:
n is the product of the number M and the integer N0,
$e_{ij}$ is a relatively prime number with n
$c_{ij}$ is the quotient of $a_{ij}^*(x)$ by $g_{ij}(x)$,
the polynomial $g_{ij}(x)$ is the generator polynomial of the smallest cyclic code of length N0 containing the polynomial $g_i(x^{e_{ij}})$ modulo $x^{N0}+1)$,
at least one permuted sequence being different from the corresponding sequence $a_i$.

According to a seventh aspect, the present invention relates to a decoding device characterised in that it includes a processing means adapted:

1/ to take into account:
a predetermined integer M1, equal to or greater than 2,
a number K, greater than or equal to 1, of sequences $a_i$ (i=1, . . . , K) of binary data representing a physical quantity, each sequence $a_i$ having:
a polynomial representation $a_i(x)$ which is a multiple of a predetermined polynomial $g_i(x)$, and
a number of binary data equal to the product of any integer number M and the integer N0, the smallest integer such that the polynomial $x^{N0}+1$ is divisible by each of the polynomials $g_i(x)$;

2/ to perform an operation of parallel turbodecoding of K sequences of symbols using the divisor polynomials $g_{ij}(x)$.

3/ to perform, for each $a_j$, M1 permutation operations, at least one of which is not identity, each permutation being, in a representation where the binary data of each sequence $a_i$ are written, row by row, in a table with N0 columns and M rows, the resultant of any number of so-called elementary permutations which, each:
either has the property of transforming the cyclic code of length N0 and with a generator polynomial $g_i(x)$ into an equivalent cyclic code with a generator polynomial $g_{ij}(x)$ which can be equal to $g_i(x)$, and acts by permutation on the N0 columns of the table representing $a_j$,
or is any permutation of the symbols of a column of said table.

According to an eighth aspect, the present invention relates to a decoding device characterised in that it has a processing means adapted:

1/ to take into account:
a predetermined integer M1, equal to or greater than 2,
a number K, greater than or equal to 1, of sequences $a_i$(j=1, . . . , K) of binary data representing a physical quantity, each sequence $a_i$ having:

a polynomial representation $a_i(x)$ which is a multiple of a predetermined polynomial $g_i(x)$ and has no multiple polynomial factors, and a number of binary data equal to the product of any odd integer number M and the integer N0, the smallest integer such that the polynomial $x^{N0}+1$ is divisible by each of the polynomials $g_i(x)$;

2/ to perform an operation of parallel turbodecoding of K sequences of symbols using the divisor polynomials $g_{ij}(x)$.

3/ to effect a permutation operation producing so-called "permuted" sequences, $a_{ij}^*$, (i=1, ..., K; j=1, ..., M1), each permuted sequence $a_{ij}^*$ having a polynomial representation equal to $a_{ij}^*(x)=a_i^*(x^{eij})$ modulo $(x^n+1)$, where:

n is the product of the number M and the integer N0, $e_{ij}$ is a relatively prime number with n $c_{ij}$ is the quotient of $a_{ij}^*(x)$ by $g_{ij}(x)$, the polynomial $g_{ij}(x)$ is the generator polynomial of the smallest cyclic code of length N0 containing the polynomial $g_i(x^{eij})$ modulo $(x^{N0}+1)$, at least one permuted sequence $a_{ij}^*$ being different from the corresponding sequence $a_i$.

The invention also relates to:

an information storage means which can be read by a computer or a microprocessor storing instructions of a computer program, characterised in that it enables the method of the invention as briefly disclosed above to be implemented, and an information storage means which is removable, partially or totally, and which can be read by a computer or a microprocessor storing instructions of a computer program, characterised in that it enables the method of the invention as briefly disclosed above to be implemented.

The invention also relates to:

a device for processing signals representing speech, which includes a device as briefly disclosed above, a data transmission device having a transmitter adapted to implement a packet transmission protocol, which includes a device as briefly disclosed above, a data transmission device having a transmitter adapted to implement the ATM (Asynchronous Transfer Mode) packet transmission protocol, which has a device as briefly disclosed above, a data transmission device having a transmitter adapted to implement the packet transmission protocol, on a network of the ETHERNET (registered trade mark) type, a network station, which has a device as briefly disclosed above, a data transmission device having a transmitter transmitting on a non-cable channel, which has a device as briefly disclosed above, and a device for processing sequences of signals representing at most one thousand binary data, which has a device as briefly disclosed above.

As these coding and decoding devices, these coding and decoding methods and these signal processing, data transmission and sequence processing devices and this network have the same particular characteristics and the same advantages as the coding method as briefly disclosed above, these particular characteristics and these advantages will not be repeated here.

The invention will be understood more clearly from a reading of the description which follows, made with regard to the accompanying drawings, in which.

Figure 1:
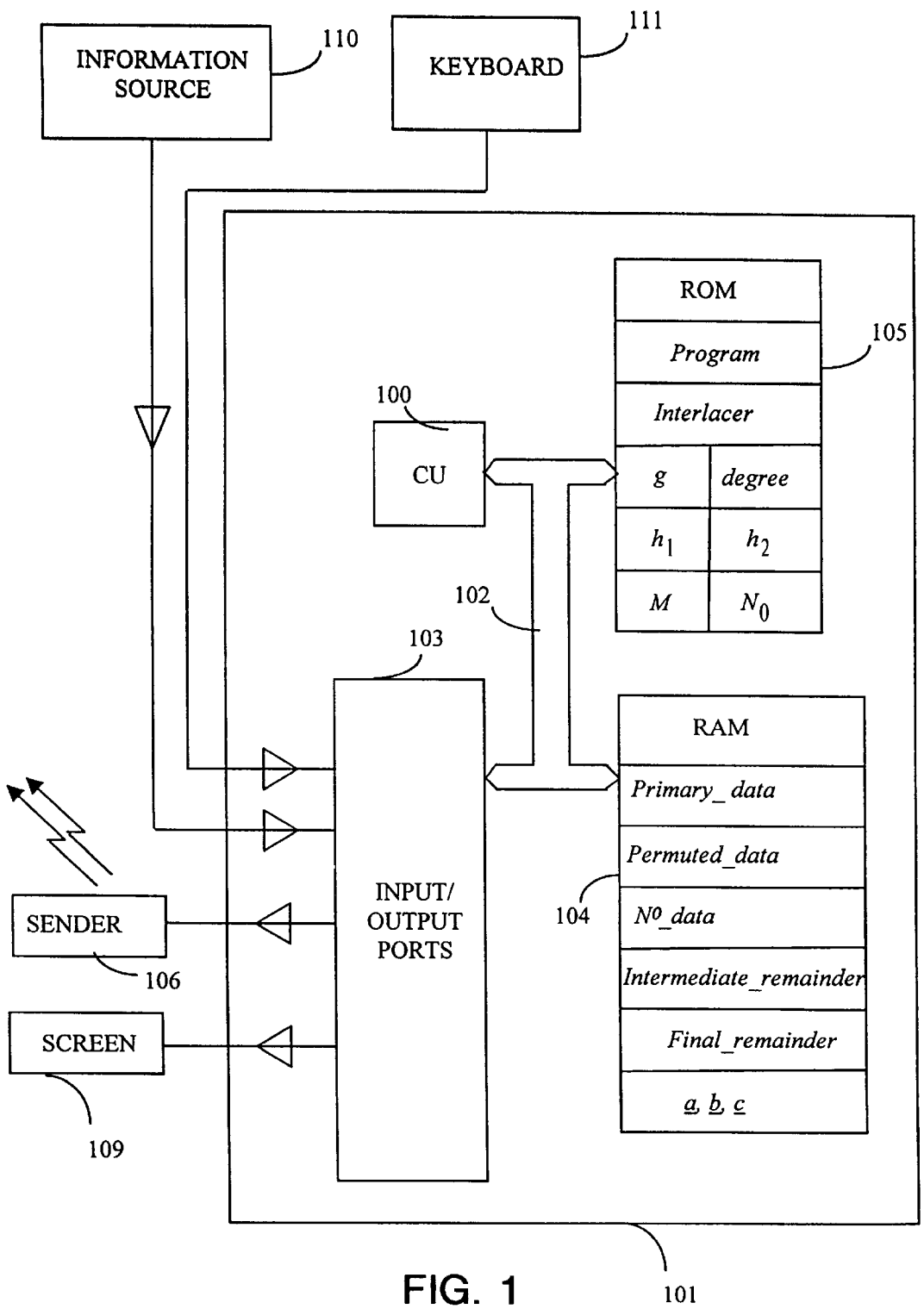
FIG. 1 depicts schematically an electronic device incorporating a coder according to a first embodiment of the present invention.

In the following description, the first control sequence will always be obtained from non-interlaced information sequences, although the scope of the invention extends also to the general case.

The description of embodiments of the invention is, hereinafter, divided into two parts, respectively dedicated to the case in which a single sequence of symbols is coded and to the case in which two sequences of symbols are simultaneously coded.

I—FIRST EMBODIMENT

In the description which follows, the term "data" will be given both to symbols representing information and to additional or redundant symbols.

Before beginning the description of a particular embodiment, the mathematical bases of its implementation are given below In the invention, $g(x)$, $h_1(x)$ and $h_2(x)$ being predetermined, it is stated that it is wished that the sequences b and c, defined respectively by the divisions $b(x)=a(x).h_1(x)/g(x)$ and $c(x)=a^*(x).h_2(x)/g(x)$, should have no remainder.

To this end, $g(x)=1+\Sigma_{i=1 \ to \ m-1} g_i.x^i+x^m$ being a polynomial of predetermined degree m, the smallest number N0 is sought such that $g(x)$ divides the polynomial $x^{N0}-1$. It is known that this number exists. For example $g(x)=1+x+x^3$, N0=7.

Then, choosing any number M, a length of sequence a equal to M.N0 is chosen, which amounts to determining the length (that is to say the number of binary data) of the sequence u incorporated in the sequence a as being equal to M.N0 minus the degree of $g(x)$.

Thus, in order to form the sequence a, there is juxtaposed with the sequence u formed by k binary data $u_i$ to be transmitted, a number of additional binary data equal to the degree of the polynomial $g(x)$, the added data guaranteeing the absence of a remainder in the division of $a(x)$ by $g(x)$.

It will be recalled that the division effected here is made, modulo 2, on the coefficients of the ascending powers of $a(x)$.

By way of example, if the sequence u is the sequence (1, 0, 0, 1, 0, 0), and the sequence g is the sequence (1, 1, 0, 1), the division is written:

```
 1 0 0 1 0 0       | 1 1 0 1
 1 1 0 1           | 1 1 1 1 0 1
   1 1 0 1         |
     1 1 0 1       |
       1 1 0 1     |
         0 0 0 0   |
           1 1 0 1 |
-------------------
 0 0 0 0 0 0 0 0 1
``` which is also written. (1, 0, 0, 1, 0, 0, 0, 0, 0)=(1, 1, 0, 1t)×(1, 1, 1, 1, 0, 1)+(0, 0, 0, 0, 0, 0, 0, 0, 1), that is to say also (1, 0, 0, 1, 0, 0, 0, 0, 1)=(1, 1, 0, 1)×(1, 1, 1, 1, 0, 1), adding, term by term, the remainder sequence (0, 0, 0, 0, 0, 0, 0, 0, 1) to the sequence u first of all supplemented by m "0"s.

Thus, by substituting, for the sequence u=(1, 0, 0, 1, 0, 0), the sequence a=(1, 0, 0, 1, 0, 0, 0, 0, 1), formed by this addition, and the first binary data of which are all the binary data of the sequence u, the divisibility of the polynomial a(x) by the polynomial g(x) associated with the sequence g=(1, 1, 0, 1) and, consequently, of $a(x) \cdot h_1(x)$ by g(x) is guaranteed, whatever the sequence h, associated with the polynomial $h_1(x)$, which supplies the definition of the sequence b by $b(x)=a(x) \cdot h_1(x)/g(x)$.

In order to determine the sequence a*(x), which has, after permutation, the same binary data as the sequence a, but in a different order, an interlacer is chosen, a representation of which can be given as follows: the binary data of the sequence a being arranged in a table of N0 columns and M rows, there is performed on these data at least one permutation in a set of permutations including, on the one hand, the automorphisms of the binary cyclic code of length N0 and with the generator polynomial g(x), permuting with each other at least two of the N0 columns of the table and, on the other hand, the permutations operating solely on data in one and the same column and permuting with each other at least two of the said data items, and only one or more permutations of this set.

This is because the inventors have discovered that only the permutations which can be thus represented guarantee that, for any polynomial a(x) whose division by g(x) has no remainder, the permuted polynomial a(x) has a division by g(x) which has no remainder.

In such a succession, there can, for example where N0=7 and $g(x)=1+x+x^3$, be found successively:

a permutation of the binary data of the first column, a permutation of the binary data of the third column, the replacement of the second column by the fourth, the replacement of the fourth column by the second, the replacement of the fifth column by the sixth and the replacement of the sixth column by the fifth.

With regard to the automorphism, giving the name Cg to the binary cyclic code of length N0 and with the generator polynomial g(x), that is to say all the multiples of g(x), modulo $x^{N0}-1$, the permutations of the coordinates of this code which transform any word of this code into another word of this code are considered. The set of permutations of coordinates which have this property has a group structure and is called the Cg automorphism group.

For more details, the reader can refer to the work by Mrs F. J. MACWILLIAMS and Mr N. J. A. SLOANE, "The theory of error-correcting codes" published by North-Holland in 1977.

Amongst all these permutations, the inventors have selected the following permutations, which have the advantage of constituting only a small family, all the members of which can be tested in order to choose the most effective permutation.

As mentioned above, M is chosen so as to be odd and g(x) such that the corresponding number N0 is also odd. By writing the successive powers of 2 modulo M.N0, there is obtained what is called the cycle of 2, modulo M.N0. In this cycle, by choosing any term e, the following permutation is effected:

the polynomial a(x) giving, after permutation, the polynomial a*(x), the latter is defined by $a^*(x)=a(x^e)$, thus, if $a=(a_0, a_1, a_2, \ldots, a_{M.N0-1})$, the first binary data item of a* is $a_0$, the second $a_f$, the third $a_{2f}, \ldots$, f being the inverse of e, modulo M.N0, and the multiples of f themselves being calculated modulo M.N0.

For example, by repeating $g(x)=1+x+x^3$, and therefore N0=7, and choosing M=5, this gives M. N0=35. The cycle of 2 is then written:

[1, 2, 4, 8, 16, 32, 29, 23, 11, 22, 9, 18].

Taking, for example, $e=2^8=11$, f will be equal to 16 and the sequence a* begins with the binary data: $a_0, a_{16}, a_{32}, a_{13}, a_{29}, a_{10}$, etc . . .

These permutations which are described above and which can be represented by $a^*(x)=a(x^e)$ where e is in the cycle of 2 modulo M.N0, $a(x^e)$ being taken modulo $x^{M.N0}-1$, form a small family, all the members of which can be tested in order to choose the most effective.

The selection logic is as follows: first of all g(x) of degree m, not divisible by a square polynomial, is chosen. This choice fixes the value of N0 as being the smallest integer such that g(x) divides $x^{N0}-1$. In addition, the fact that the polynomial g(x) is not divisible by a square polynomial implies that N0 is an odd number. Then $h_1(x)$ and $h_2(x)$ are chosen of any degree but preferentially at most equal to the degree m of g(x) since the maximum of the degrees of these three polynomials g(x), $h_1(x)$ and $h_2(x)$ is a determining factor in the complexity of the decoder. An odd integer M is then chosen and the cycle of 2 modulo M.N0 is calculated. An element e in this cycle of 2 is then chosen in order to specify $a^*(x)=a(x^e)$ modulo $X^{M.N0-1}-1$ from a(x), and various testing operations are performed on the turbocode associated with the interlacer thus defined.

Let us take for example $g(x)=1+x+x^3$, this imposes N0 =7. Let also $h_1(x)=1+x+x^2+x^3$, $h_2(x)=1+x^2+x^3$ and M=21 be chosen, this leads to M.N0=147 and makes it possible to calculate the cycle of 2 modulo 147 as being {1, 2, 4, 8, 16, 32, 64, 128, 109, 71, 142, 137, 127, 107, 67, 134, 121, 95, 43, 86, 25, 50, 100, 53, 106, 65, 130, 113, 79, 11, 22, 44, 88, 29, 58, 116, 85, 23, 46, 92, 37, 74}.

By testing successively the polynomials a(x) divisible by g(x) of weight equal to 2, 3, 4 and 5, it is concluded that the choice e=25 is "promising" since the a(x) polynomials of weight 2 then correspond to a coded sequence v=(a, b, c) of weight≧26, the a(x) polynomials of weight 3 corresponding then to a coded sequence v=(a, b, c) of weight≧24, the a(x) polynomials of weight 4 then corresponding to a coded sequence v=(a, b, c) of weight≧26, the a(x) polynomials of weight 5 then corresponding to a coded sequence v=(a, b, c) of weight≧30 etc.

This seems to indicate a minimum distance equal to 24, which is the best value that can be obtained in accordance with the method disclosed above for N0=7 and M=21 with g(x), $h_1(x)$ and $h_2(x)$ as indicated above.

Another possible choice is $g(x)=1+x+x^4$, which imposes N0=15. Let also $h_1(x)=1+x+x^2+x^4$, $h_2(x)=1x+x^3+x^4$ and M=27 be chosen. This leads to M.N0=405 and makes it possible to calculate the cycle of 2 modulo 405 as being {1, 2, 4, 8, 16, ..., 304, 203}. It comprises 108 numbers.

Working by successive elimination, it is concluded that the choices e=151, e=362 and e=233 are particularly promising.

In particular, for e=151, the inventors have tested the polynomials a(x) divisible by g(x) and of weight equal successively to 2, 3, 4, 5, 6 and 7, and such that if this weight is greater than or equal to 5, then the weight of a(x), denoted W(a(x)), is equal to the weight of a(x) modulo $x^{15}+1$.

When the weight of a(x) is W(a(x)), the corresponding minimum weight of W(v) is indicated in the table:

| W(a(x)) | W (v)≧ |
|---|---|
| 2 | 54 |
| 3 | 42 |
| 4 | 44 |
| 5 | 48 |
| 6 | 54 |
| 7 | 54 |

In the same way and under the same conditions, for e=362, when the weight of a(x) is W(a(x)), the minimum corresponding weight of W(v) is indicated in the table:

| W(a(x)) | W (v)≧ |
|---|---|
| 2 | 54 |
| 3 | 42 |
| 4 | 42 |
| 5 | 50 |
| 6 | 56 |
| 7 | 54 |

According to the invention, the numbers e, non-congruent at 1, modulo N0, can be used in particular.

Figure 2:
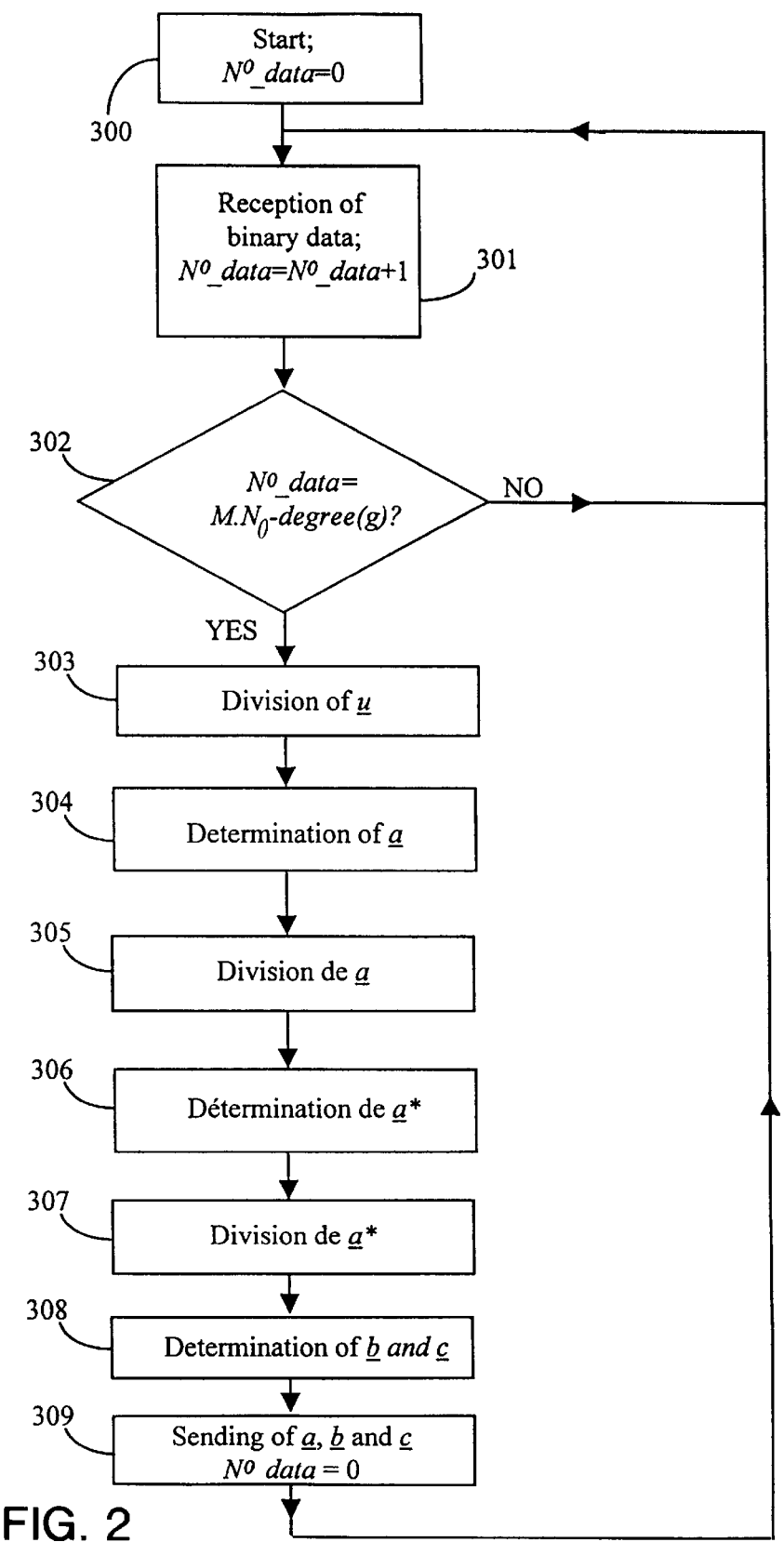
FIG. 2 depicts schematically an operating flow diagram of a coder according to the first embodiment of the present invention, as illustrated in FIG. 1.
Figure 3:
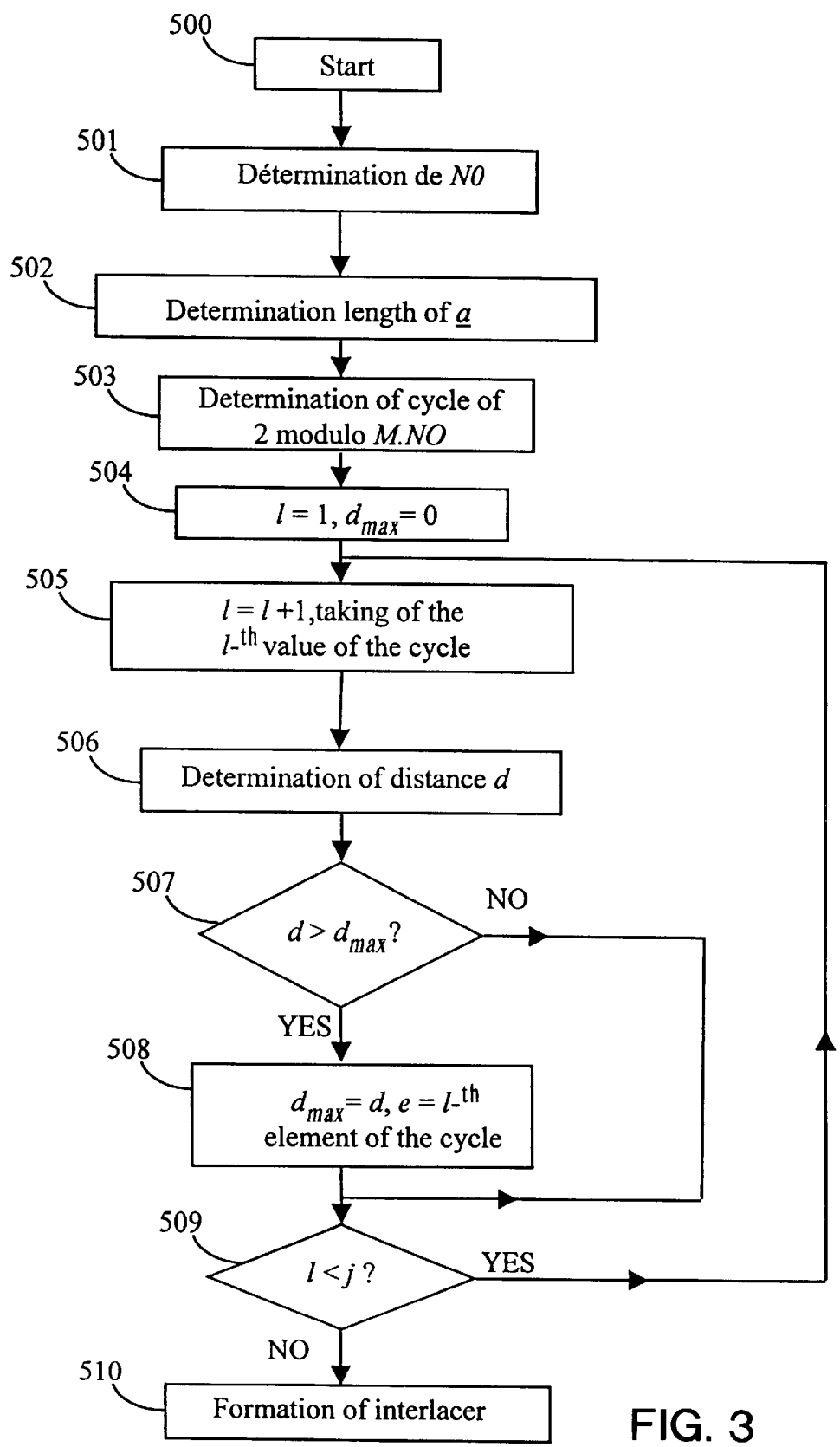
FIG. 3 depicts schematically a flow diagram describing the steps of determination of an interlacer used in the device illustrated in FIG. 1.

The description of a particular embodiment of the present invention will now be continued with regard to FIGS. 1 to 3.

FIG. 1 illustrates schematically the constitution of a network station or computer coding station, in the form of a block diagram. This station has a keyboard 111, a screen 109, an external information source 110 and a radio transmitter 106, conjointly connected to an input/output port 103 of a processing card 101.

The processing card 101 has, connected together by an address and data bus 102:

a central processing unit 100;
a random access memory RAM 104,
a read-only memory ROM 105;
the input/output port 103.

Each of the components illustrated in FIG. 1 is well known to persons skilled in the art of microcomputers and transmission systems and, more generally, information processing systems. These common elements are therefore not described here. It will be observed, however, that:

the information source 110 is, for example, an interface peripheral, a sensor, a demodulator, an external memory or another information processing system (not shown), and is preferentially adapted to supply sequences of signals representing speech, service messages or multimedia data, in the form of sequences of binary data, the radio transmitter 106 is adapted to implement a packet transmission protocol on a non-cable channel, and to transmit these packets on such a channel.

It should also be noted that the word "register" used in the description designates, in each of the memories 104 and 105, both a memory area of low capacity (a few binary data) and a memory area of large capacity (making it possible to store an entire program).

The random access memory 104 stores data, variables and intermediate processing results, in memory registers bearing, in the description, the same names as the data whose values they store. The random access memory 104 has notably:

a register "primary_data" in which there are stored, in the order of their arrival on the bus 102, the binary data coming from the information source 110, in the form of a sequence u, later supplemented to form a sequence a, a register "N°_data" which stores an integer number corresponding to the number of binary data n-m in the register "binary_data", a register "intermediate_remainder" in which there are stored successively the intermediate remainders of the division, a register used for constructing the sequence a from the sequence u, a register "final_remainder" in which there are stored the complementary binary data, in the form of a sequence, a register "permuted_data" in which there are stored, in the order of their arrival on the bus 102, the permuted binary data, as described with regard to FIG. 2, in the form of a sequence a*, and a register "a, b, c" in which there are stored, in the order in which they are determined by the central unit 100, the binary data of the sequence currently being processed.

The read-only memory 105 is adapted to store, in registers which, for convenience, have the same names as the data which they store:

the operating program of the central processing unit 100, in a register "program", the sequence g, in a register "g", the degree m of g(x), in a register "degree"

the sequence $h_1$, in a register "$h_1$", the sequence $h_2$, in a register "$h_2$", the value of N0, in a register "N0", the value of M, in a register "M", and the table defining the interlacer, in a register "interlacer".

The central processing unit 100 is adapted to implement the flow diagram described in FIG. 2.

In FIG. 2, which depicts the operation of a coder as illustrated in FIG. 1, it can be seen that, after an initialisation operation 300, during which the registers of the random access memory 104 are initialised (N°_data="0"), during an operation 301, the central unit 100 wafts to receive, and then receives a binary data item to be transmitted, positions it in the random access memory 104 in the register "primary_data" and increments the counter "N°_data".

Next, during a test 302, the central unit 100 determines whether or not the integer number stored in the register "N°_data" is equal to the product M.N0 from which the degree of g(x) is subtracted, M, N0 and the degree m of g(x) being values stored in the read-only memory 105.

When the result of the test 302 is negative, the operation 301 is reiterated. When the result of the test 302 is positive, during an operation 303, the division of the polynomial u(x) associated with the sequence of binary data stored in the register "primary_data" by the polynomial g(x) is effected, up to the last term (of the highest degree) of u(x), using, for this purpose, the register "intermediate_remainder", the remainder of this division is stored in memory in the register "final remainder".

Next, during an operation 304, the binary data stored in the register "final_remainder" are juxtaposed at the end of the sequence u in order to form the sequence a. The binary data of the sequence a are stored in memory in the register "a, b, c".

Next, during an operation 305, the division effected during the operation 303 is continued, with the additional data added during the operation 304, and the sequence b is completed in the register "a, b, c".

Then, during an operation 306, the binary data of the sequence a are successively read from the register "a, b, c", in the order described by the table "interlacer" stored in the read-only memory 105. The data which result successively from this reading are stored in memory in the register "permuted_data" of the read-only memory 104.

Next, during an operation 307, the division of the polynomial a*(x) associated with the sequence of permuted binary data stored in the register "permuted_data" by the polynomial g(x) is effected, using, for this purpose, the register "intermediate_remainder". The result of this division is stored in memory in the register "a, b c", and corresponds to the binary data of the sequence c.

During an operation 308, the sequences b and c are determined by effecting the product of the polynomials associated with the sequences b and c stored in the register "a, b, c" of the random access memory 104, and respectively the polynomials $h_1(x)$ and $h_2(x)$.

It will be observed that, by virtue of the invention, memory elements are saved by effecting the division by g(x) before the multiplication by $h_1(x)$ or $h_2(x)$.

During an operation 309, the sequences a, b, and c are sent, using for this purpose the sender 106. Next, the registers of the memory 104 are initialised again, in particular the counter "N°_data is reset to "0" and the operation 301 is reiterated.

It will be observed here that, as a variant, during the operation 309, the sequence a is sent as a whole, but only a sub-set, for example one data item out of two, of each of the sequences b and c is sent. This variant is known to persons skilled in the art as puncturing.

With regard to decoding, it will be observed that, by knowing the polynomials g(x), $h_1(x)$, $h_2(x)$ and the interlacer which, from the sequence a, supply the permuted sequence a*, a person skilled in the art knows, without any technical problem, how to produce the decoder adapted to decoding and the correction of any error affecting the triplet of sequences (a, b, c) by using the interlacer considered above and, optionally, the corresponding deinterlacer.

For this purpose, he can refer to:
 the article by Messrs. L. R. BAHL, J. COCKE, F. JELINEK and J. RAVIV entitled "Optimal decoding of linear codes for minimizing symbol error rate", published in the IEEE journal Transactions on Information Theory, in March 1974;
 the article by Messrs J. HAGENAUER, E. OFFER and L. PAPKE entitled "Itertaive decoding of binary block and convolutional codes", published in IEEE journal Transactions on Information Theory, in March 1996;
 the article by Messrs. J. HAGENAUER and P. HOEHER entitled "A Viterbi algorithm with soft decision outputs and its applications", published with the reports of the conference IEEE GLOBECOM, pages 1680–1686, in November 1989;
 the article by Messrs. J. HAGENAUER, P. ROBERTSON and L. PAPKE entitled "Iterative (turbo)decoding of systematic convolutional codes with the MAP and SOVA algorithms", published by the journal Informationstechnische Gesellschaft (ITG) Fachbericht, pages 21–29, October 1994; and
 the article by Messrs. C. BERROU, S. EVAN0 and G. BATTAIL, entitled "Turbo-block-codes" and published with the reports of the seminar "Turbo Coding" organised by the Technology Institute of Lund (Sweden) (Department of Applied Electronics) in August 1996.

FIG. 3 depicts the steps of an algorithm determining the value of e specifying the interlacer to use. These steps can be performed by a computer of a known type (not depicted), in which the registers "N0", "M","interlacer", "d", "$d_{max}$", "e" and "j" are situated, in the random access memory.

During an operation 501, $g(x)=1+\Sigma_{i=1\ to\ m-1}\ g_l \cdot x^i + x^m$ being the predetermined polynomial of degree m which corresponds to the sequence g, the smallest strictly positive integer number N0 such that g(x) divides the polynomial $x^{N0}-1$ is sought. It is known that this number exists. For example, for $g(x)=1+x+x^3$, N0=7. To this end, the divisions of the polynomials $x^i-1$ by g(x) are effected successively, commencing with a value of i equal to the degree m of g(x) and progressively incrementing i, with an incrementation step of 1, until the remainder of the division is nil, modulo 2. When the remainder is nil, the value of i is put in the register N0. It will be recalled that the division performed here is effected, modulo 2, on the coefficients of the ascending powers of $x^i-1$.

Then, choosing an odd number M, so that the product M.N0 is greater than or equal to the number of binary data $u_i$ which must be transmitted in the same frame, added to the degree m of g(x), during an operation 502, a length of sequence a equal to M.N0 is chosen, which amounts to determining the length (that is to say the number of binary data) of the sequence u incorporated in the sequence a as being equal to M.N0 minus the degree m of g(x).

Then, during the operations 503 to 509, the central unit 100 determines whether the interlacer associated with e is to be taken into account, which means that there is no sequence a of low weight for which the sequence v=(a, b, c) also has a low weight.

In the embodiment described and depicted, the determination of a* will consist of replacing $a=(a_0, a_1, \ldots)$ by $a^*=(a_0, a_f, a_2, \ldots)$, where the multiples of f are calculated modulo M.N0. When f is equal to a power of 2 different from 1, modulo M.N0, this permutation is indeed of the type stated. It can in fact be represented by a permutation which permutes binary data only within each column of the table, followed, when f is equal to a power of 2 different from 1, modulo N0, by a permutation of at least two of the columns with each other, this last permutation being an automorphism of the binary cyclic code of length N0 and with a generator polynomial g(x). When f is equal to 1, modulo N0, this permutation relating to the columns is the "trivial" permutation or "identity" permutation, that is to say it maintains the position of the columns in the table.

To this end, in this particular embodiment of the present invention, during the operation 503, the central unit 100 determines the successive powers of 2 modulo M.N0, in order to obtain what is referred to as the cycle of 2, modulo M.N0, this cycle being completed as soon as one of the powers of 2 is equal to 1, modulo M.N0. The number of terms j of this cycle is stored in the register "j".

Then, during the operation 504, the intermediate values l and $d_{max}$ stored in the registers "l" and "$d_{max}$" are initialised respectively to the value "1" and to the value "0".

Next, during an operation 505, the value of "l" is incremented by 1 and the l-th value of the cycle of 2, modulo M.N0, is taken.

Then, during an operation 506, if this value is not equal to 1 modulo M.N0, the weight of the sequence $\underline{v}=(a, b, c)$ is determined for the sequences a of low weight, with the permutation defined by $a^*(x)=a(x^e)$ (thus, if $a=(a_0, a_1, a_2, \ldots, a_{M.N0-1})$, the first binary data of $a^*$ is $a_0$, the second $a_f$, the third $a_{2f}, \ldots$, as disclosed above, the index being calculated modulo M.N0).

To this end, since the distance between two sequences is the weight (that is to say the number of non-nil binary data) of the sequence constituted by the difference of the homologous binary data of these sequences, the process is limited to the analysis of the distance of the sequences with the nil sequence, the polynomials a(x) are enumerated by ascending weight, the sum of the weights of the sequences in one and the same triplet (a, b, c) is measured and a search is made for the minimum weight for a given e, for the sequences a of low weight, and, once all these minimum weights have been determined for e in the cycle of 2, for the value of e which corresponds to the highest weight.

The distance is then stored in the register "d" of the random access memory 104. Next, if, during a test 507, the value stored in the register "d" is greater than the value stored in the register "$d_{max}$", then, during the operation 508, the value of the register "$d_{max}$" is modified in order to take the value d and the value of the l-th element of the cycle considered is stored in memory in the register "e".

Following the operation 508 or, when the result of the test 507 is negative, as long as the value of l is less than j, test 509, the operation 505 is reiterated.

The table "interlacer" is then formed as follows:

$a^*(x)=a(x^e)$, thus, if $a=(a_0, a_1, a_2, \ldots, a_{M.N0-1})$, the first binary data item of $a^*$ is $a_0$, the second $a_f$, the third $a_{2f}, \ldots$, as disclosed above, the index being calculated modulo M.N0.

According to a variant, not shown, the triplet (a, b, c) is constructed as follows:

a(x) and $b(x)=a(x).h_1(x)/g(x)$ are defined as above, given a polynomial $g_2(x)$ chosen so that the smallest integer N2 such that $g_2(x)$ divides the polynomial $x^{N2}-1$ is equal to the smallest integer N0 such that g(x) divides the polynomial $x^{N0}-1$, a permutation P is chosen which transforms any word of the binary cyclic code of length N0 and with a generator polynomial g(x) into a word of the binary cyclic code of length N2 and with a generator polynomial $g_2(x)$. It will be noted that such a permutation exists only for the polynomials $g_2(x)$ generating cyclic codes equivalent to Cg. This verification is well known to persons skilled in the art and for this reference should be made to page 234 of the book by Mrs F. J. MACWILLIAMS and Mr N. J. A. SLOANE mentioned above;

according to the invention, the permutation which, from the sequence a, associated with the polynomial a(x) divisible by g(x), produces the sequence $a^{}$, associated with the polynomial $a^{}(x)$, divisible by $g_2(x)$, is then produced by any permutation producing, from a(x), a first sequence $a^*(x)$ divisible by g(x) as explained above, followed by the permutation P which has just been introduced and which acts on the columns of the table with M rows and N0 columns containing first of all a and next $\underline{a}^*$ in order to permute these columns with each other and produce $a^{**}$.

The scope of the invention is not limited to the embodiments described and depicted but quite the contrary extends to any modifications and improvements within the capability of persons skilled in the art.

In particular, passage at throughputs of a quarter or less, by adding one or more additional interlacers, is effected for each interlacer, by applying the principles set out above. In all these cases, puncturing can be used to raise the throughput of the code. It will be recalled that puncturing consists of transmitting only some of the check symbols.

In addition, devices which are the object of the present invention are advantageously produced by implementing, in order to effect the arithmetic calculations, polynomial multiplication, polynomial division, the function of interlacing and the functions of elementary decoding, dedicated circuits not including a processor (such a processor can nevertheless be used for controlling the operation of these devices). The use of such dedicated circuits makes it possible in fact to reach higher information flow rates.

It should be noted that, in the first embodiment, the throughput is, without puncturing, close to one third since, for a sequence of n-m symbols to be coded, there are two sequences of n check symbols.

II—SECOND EMBODIMENT

In the second embodiment of the present invention, throughputs greater than 1/3 are considered, obtained without puncturing; for two sequences of n-mn symbols to be coded, two sequences of n check symbols are for example supplied, that is to say a throughput close to one half.

Before beginning the description of the second embodiment, the mathematical bases of its implementation are given below.

In order to introduce the first embodiment, a class of algebraic interlacers to be used with turbocoders with a throughput close to one third is presented. The main advantage of these interlacers is to preserve the divisibility of the information polynomials by a given polynomial g(x) which partially characterises the coder. As a result the probability of error per coded information bit is better independent of the position of the bits in the information sequence. As another advantage, the algebraic description of these interlacers makes their enumeration and individual evaluation possible. In addition, it is hoped that the performance of this small set of interlacers is representative of the performance of all the interlacers.

However, in many circumstances, for example in the context of wireless transmissions, a better throughput is necessary.

The second embodiment is concerned particularly with throughputs greater than or close to one half, without the use of puncturing methods.

IIa—High-throughput turbocodes with interlacers of the "x to $x^e$" type.

The following systematic convolutional coder K x (K+2) will be considered:

$$G = \begin{matrix} 1 & 0 & \cdots & 0 & h_1/g & f_1/g \\ 0 & 1 & \cdots & 0 & h_2/g & f_2/g \\ \cdots & \cdots & \cdots & \cdots & \cdots & \cdots \\ 0 & 0 & \cdots & 1 & h_K/g & f_K/g \end{matrix} \quad (1)$$

in which $h_i$, $f_l$ and g are polynomials with binary coefficients of indeterminate x representing the delay operator.

In a conventional fashion, the transmitted information is represented by a K-tuple $a=(a_1, \ldots, a_K)$ of polynomials $$a_j = \sum_{j=0 \text{ to } n-1} a_{ij} \cdot x^j,$$

with binary coefficients $a_{ij}$ and the information is coded in $\underline{v}$=aG, which is a (K+2)-tuple of sequences of indeterminate x:

$$\underline{v} = \left[a_1, \ldots, a_K, \left(\sum_{i=1 \text{ to } K} a_i h_i\right)/g, \left(\sum_{i=1 \text{ to } K} a_i f_i\right)/g\right]$$

It should be noted that "sequences" rather than "polynomials" is written here, since the sums are not necessarily multiples of g and, if they are not, division by g makes a sequence infinite and ultimately periodic.

In order to improve the performance of this type of coder, the last component $$\left(\sum_{i=1 \text{ to } K} a_i f_i\right)/g \text{ of } \underline{v} \text{ can be replaced by } \left(\sum_{i=1 \text{ to } K} a_i^* h_i\right)/g$$

where $a_i^*$ represents the sequence obtained from the sequence $a_i$ by permutation of its coefficients. The transformation at each sequence $a_i$ into the sequence $a_i^*$ is referred to as "interlacing" (see for example the article by Messrs. C. BERROU and A. GLAVIEUX entitled "Near Optimum error-correcting coding and decoding: turbo-codes" published by *IEEE Transactions on Communication,* Volume COM-44, pages 1261 to 1271, in October 1996).

Figure 4:
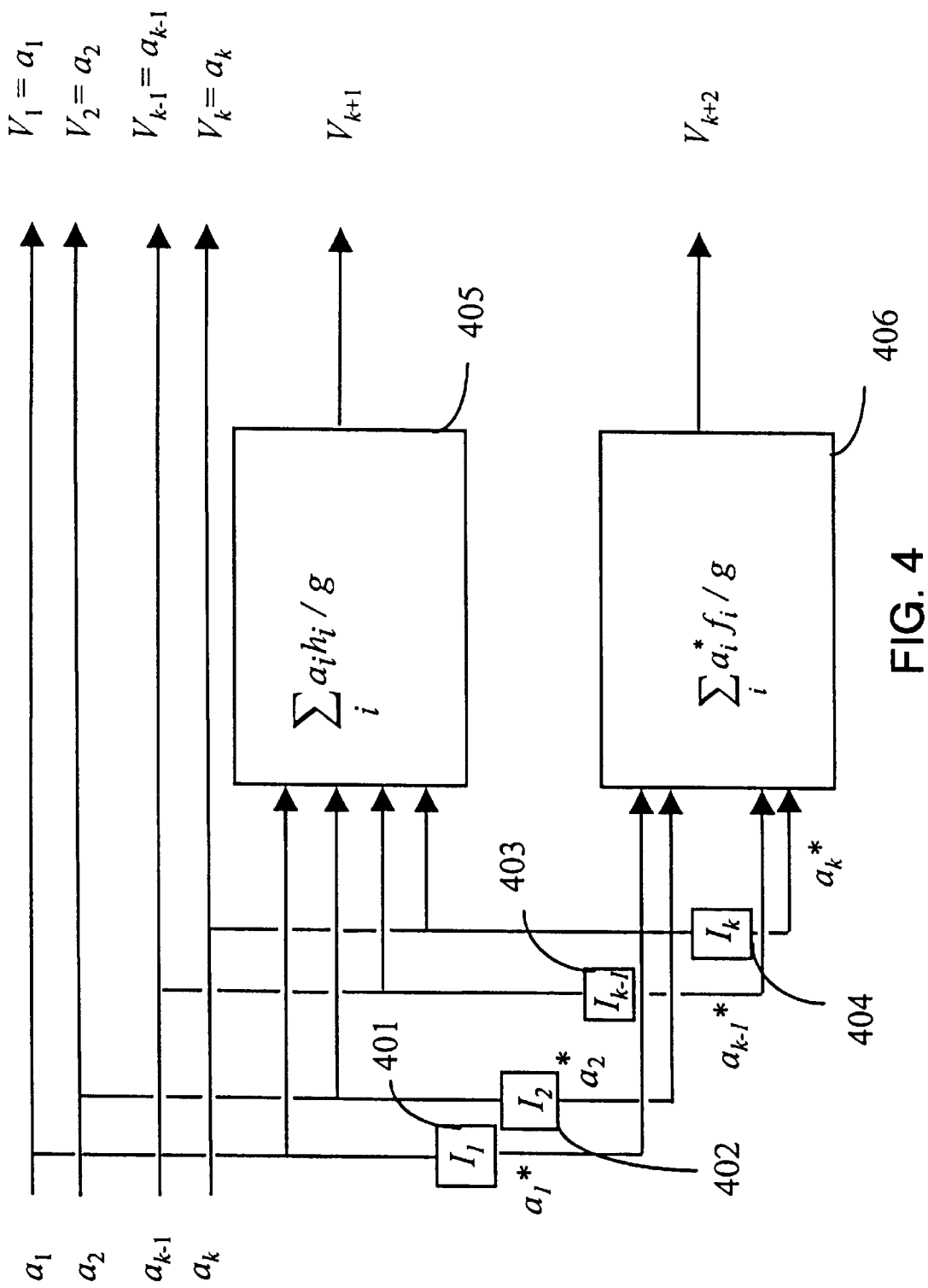
FIG. 4 depicts schematically a coder according to the second embodiment of the present invention.

FIG. 4 gives an illustration of a coder performing this operation. In this figure, it will be observed that, for K sequences of symbols at the input, the coder sends, at the output:

these K sequences of identical symbols, a sequence of check symbols formed by effecting the sum of the products of the polynomials associated with the information sequences a, and predetermined polynomials h, and dividing this sm by a predetermined polynomial g (coder 401);

a sequence of check symbols formed by first of all interlacing each information sequence $a_i$ by an interlacer $l_i$ (interlacers 402 to 405) in order to supply a sequence $a_i^*$, then effecting the sum of the products of the polynomials associated with the sequences $a_i^*$ and predetermined polynomials $f_i$ and dividing this sum by a predetermined polynomial g (coder 406).

Figure 5:
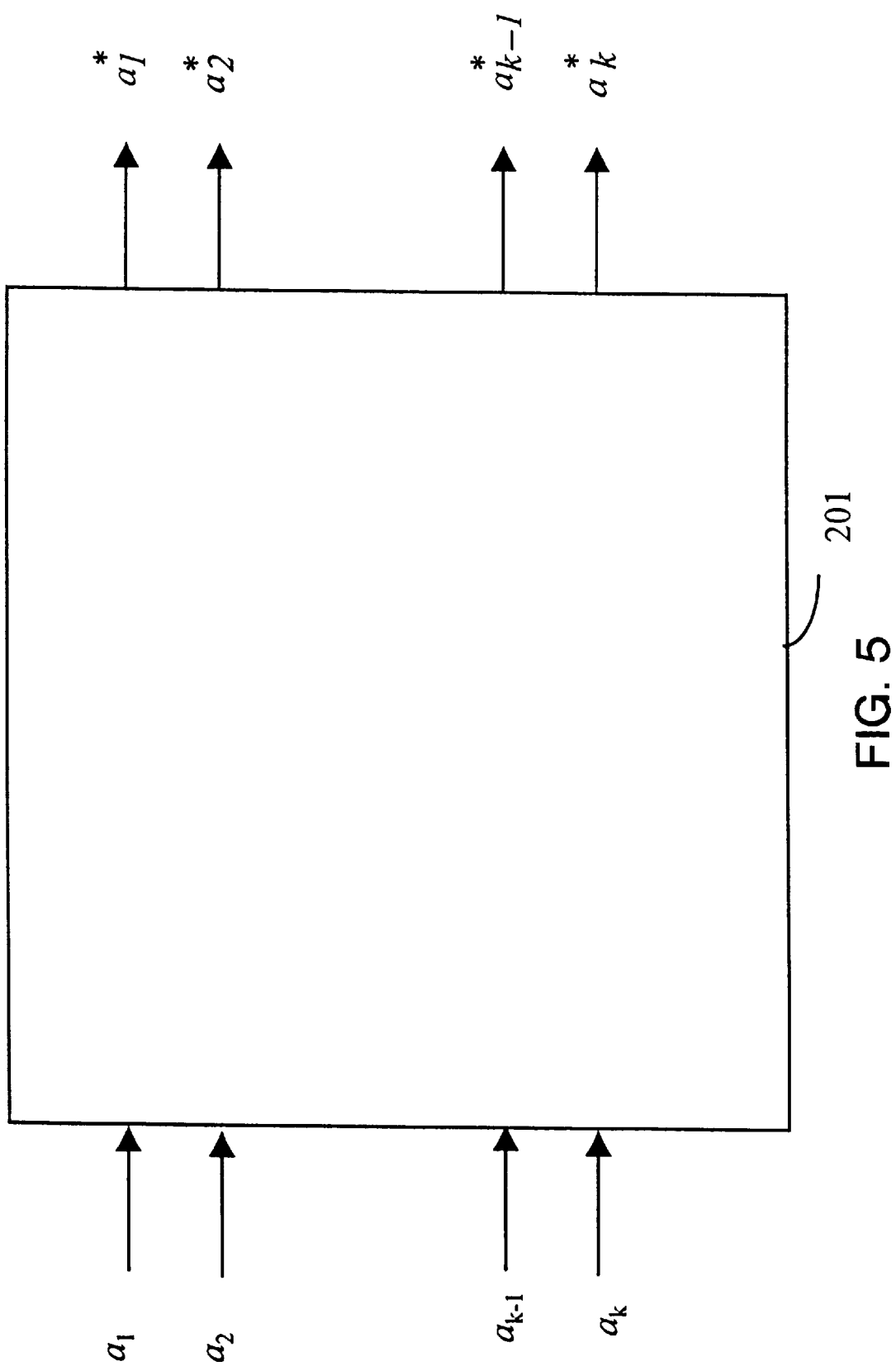
FIG. 5 depicts schematically the general form of interlacers acting on several sequences of symbols to be coded.

It should be noted here that the set of interlacers $l_i$ 402 to 406 illustrated in FIG. 1 is already a restriction of the interlacer 201 illustrated in FIG. 5 in which each sequence $a_i^*$ can contains symbols of the sequence $a_j$ with j different from i.

According to general characteristics of the present invention, in a representation in which the binary data of each sequence $a_i$ are classified in a table of N0 columns and M rows, each interlacer $l_i$ has:

at least one permutation in a set of permutations including, on the one hand, the automorphisms of the binary cyclic code of length N0 and with a generator polynomial g(x), permuting with each other at least two of the N0 columns of the table and, on the other hand, the permutations working solely on the data of the same column and permuting with each other at least two of the said data, and no permutation outside said set.

According to particular characteristics of the present invention, there is applied, to coders with a throughput Kl(K+2), with K representing an arbitrary positive integer value, interlacings of the type "x to $x^e$" described with regard to the first embodiment which concerns the value K=1.

A description will now be given below of the case K≧2 (second embodiment).

Let a polynomial $g(x)=1+g_1x+g_2x^2+\ldots +g_{m-1}x^{m-1}+x^m$.

Let N0 be the smallest integer such that g(x) divides $x^{N0}+1$.

Finally, let n be equal to an odd multiple of N0: n=M.N0.

The polynomial g(x) is then a divisor of the polynomial $x^n+1$. For example, with $g(x)=1+x+x^4$, n can be chosen amongst the values 15, 45, 75, . . . , 225, . . . , 405, . . . Other details concerning these divisibility properties can be found in the work by W. W. PETERSON and E. J. WELDON entitled "Error-correcting codes " published by MIT Press, Cambridge, Mass., 1972.

The information is represented by a sequence $u=(u_1, \ldots, u_K)$ in which each of the K components $u_i$ is represented by polynomial $u_i(x)$ of formal degree n-m-1 with binary coefficients. To each polynomial $u_i(x)$, there is added a termination, $\Sigma_{j=n-m \text{ to } n-1} (u_i)_j x^i$, a termination of m bits to make the polynomial $a_i=u_i+\Sigma_{j=n-m \text{ to } n-1} (u_i)_j x^i$ divisible by g(x).

The resulting K-tuple $a=(a_1, \ldots, a_K)$ is then coded in order to produce two check sequences.

The first is given by $\Sigma_{i=1 \text{ to } K} a_i h_i/g$ and it is a polynomial because the polynomial g(x) divides the K polynomials $a_i$. The second is given by $\Sigma_{i=1 \text{ to } K} a_i^* fg$, the interlacing of $a_i(x)$ into $a_i^*(x)$ being given by:

$$a_i^*(x)=a_i(x^e) \text{ modulo } x^n+1 \qquad (2)$$

where e is equal to a power of 2 ($e=2^f$) taken modulo n. This type of "x to $x^e$" permutation was presented in the first part concerning K=1 and guarantees the divisibility of $a_i^*$ by g when $a_i$ is divisible by g.

A few examples will now be given with K=2.

A 2×4 turbocoder of the form described in (1) and specified by $g(x)=1+x+x^3$; $h_1(x)=f_2(x)=1+x^2+x^3$; $h_2(x)=f_1(x)=1+x+x^2+x^3$ and n=147 will be considered.

With this value of n, 147, there are 42 numbers e which are each the residue, modulo 147, of a power of 2. For each of these values of e, the corresponding turbocode was simulated on an additive white gaussian noise channel (known to persons skilled in the art under the English acronym "AWGN" standing for "Additive White Gaussian Noise"), for different values of the ratio between the energy per bit $E_b$ and the noise power per hertz (also referred to as the noise spectral density), N.

Figure 6:
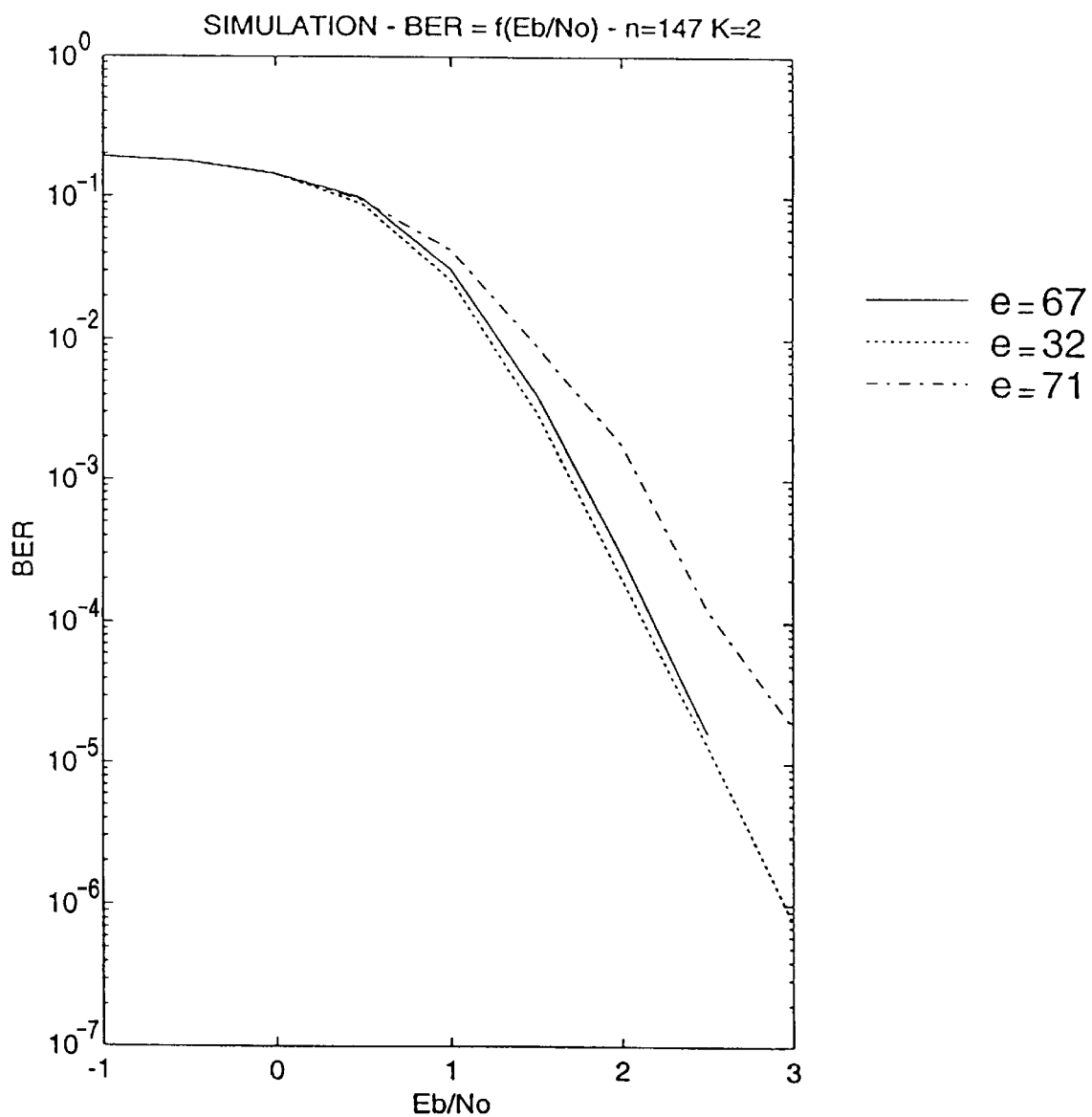
FIG. 6 depicts a performance curve of particular examples of methods and devices according to the second embodiment of the present invention.

The corresponding values of the curves of the error rates per bit ("BER") as a function of the signal/noise ratio, are depicted in FIG. 6, for n=147, K=2 and for three different values of e: $e=67=2^{14}$, $e=32=2^5$ and $e=71=2^9$. The first two values represent "good" values of e, amongst the 42 possible values, and the last value of e represents few "less good" values: 1, 2, 4, 109, 142 and 50.

With the same g(x), $h_i(x)$, $f_i(x)$, for i=1 or 2, but with a higher value of n, the same simulations can be effected. The cases n=413 and n=917 have been selected because they offer a large number of values of different powers of 2, module n. For n=413, there are effectively 174 such different values, and for n=917, there are 390 such different values.

The inventors observed that no level stage on the error curve seems to appear with the implementation of the present invention for a value of the error probability per bit after decoding of around $10^{-5}$, when the value of e is chosen judiciously. It should also be noted that the interlacing of the $a_i(x)$ polynomials in order to produce $a_i^*(x)=a_i(x^e)$ module $x^n+1$ can be effected for each value of i, with a different value of e but always with the form of an $l^{th}$ power of 2: $e=2^l$. Preferentially, the same interlacers are used for all the values of i, which preserves the identity of the k-tuples of symbols.

IIb—Specification of the turbocoders with $K \geq 2$

The following 3×5 turbocoder will for example be considered:

$$G = \begin{matrix} 1 & 0 & 0 & h_1/g & f_1/g \\ 0 & 1 & 0 & h_2/g & f_2/g \\ 0 & 0 & 1 & h_3/g & f_3/g \end{matrix}$$

where g is an irreducible polynomial with binary coefficients which is not divisible by a square polynomial. This matrix G codes a triplet of information $u=(u_1, u_2, u_3)$ as:

$$v=[a_1, a_2, a_3, (\Sigma a_i h_i)/g, (\Sigma a_i^* f_i)/g]$$

where $a_i$ is obtained from $u_i$ and $a_i^*$ from $a_i$, as disclosed with regard to the first embodiment.

An element which influences the minimum distances of such a code is the minimum number of non-nil components of the 5-tuple v.

It is possible to guarantee that any 5-tuple $v=(v_1, \ldots, v_5)$ of the turbocode contains at least three non-nil sequences $v_i$.

In order to demonstrate this, $a_i^*$ is written explicitly as $a_i(x^e)$ (reduced modulo $x^n+1$), and the inverse of e modulo n has been represented by "d":

$$ed=1 \; (n),$$

an equation in which "(n)" means "modulo n".

It is then noted that the equation $\Sigma a_i(x^e)f_i(x)=0$ modulo $(x^n+1)$ is equivalent to the equation $\Sigma a_i(x^e)f_i(x)=0$ modulo $(x^n+1)$.

This results from the fact that e and d are relatively prime with n, so that, for each b(x) of degree less than or equal to n−1, $b(x^e)$ and $b(x^d)$, taken modulo $(x^n+1)$ are simply obtained by permutation of the coefficients of b(x), and that, if the polynomial $a(x^e)$ modulo $(x^n+1)$ is denoted $[a(x)]^{\pi(e)}$, this gives:

$$[a(x)f(x)]^{\pi(e)}=[a(x)]^{\pi(e)}[f(x)]^{\pi(e)} \text{ modulo } (x^n+1).$$

It results from the theory of codes known as "MDS " (standing for "Maximum Distance Separable", that any non-nil v in the code generated by G will always contain at least three non-nil components, if the following two conditions are satisfied:

none of the polynomials $h_i$ and $f_j$ is nil modulo $x^{N0}+1$, where N0 is the smallest integer such that g(x) divides $x^{N0}+1$, N0 being odd since the polynomial g(x) is not divisible by any polynomial square, and no matrix 2×2 of the form $$h_i(x)f_i(x^d)$$
$$h_j(x)f_j(x^d)$$

with i different from j, has a determinant which is nil, modulo $x^{N0}+1$.

A similar property is valid for any coder of a turbocode of dimension K and length N1, with a number of redundancies M1=N1−K>2. In the latter case, the coder resembles:

$$G = \begin{matrix} 1 & 0 & \cdots & 0 & h_{1,1}/g & h_{1,2}/g & \cdots & h_{1,N1-K}/g \\ 0 & 1 & \cdots & 0 & h_{2,1}/g & h_{2,2}/g & \cdots & h_{1,N1-K}/g \\ \cdots & \cdots & \cdots & \cdots & \cdots & \cdots & \cdots & \cdots \\ 0 & 0 & \cdots & 1 & h_{K,1}/g & h_{K,2}/g & \cdots & h_{K,N1-K}/g \end{matrix}$$

and any information sequence $u=(\underline{u}_1, \ldots, u_k)$ is first of all coded as $a=(\underline{a}_1, \ldots, a_k)$, and then as:

$$v=[a_1, \ldots, a_k, (\Sigma a_i h_{i,1})/g, (\Sigma a_i(x^{e2})h_{i,2})/g, \ldots, (\Sigma a_i(x^{eN0,k"})h_{i,k})/g]$$

Let $d_j$ be the inverse of $e_j$ modulo n: $d_j e_j=1(n)$. Each non-nil v in the code generated by G always contains at least N1−K+1 non-nil components if, for each integer number r such that $1 \leq r \leq N1-K$, each sub-matrix r×r of G extracted from its last N1−K columns and where $h_{1,j}(x)$ is replaced by $h_{i,j}(x^{dj})$, has a non-nil determinant, module $x^{N0}+1$.

It should be noted here that the decoding of the redundancy turbocodes N1−K>2 has already been considered. For example, the article by D. DIVSALAR and F. POLLARA entitled "Multiple Turbocodes for Deep Space Communications", TDA Progress Report 42-121, of May 15, 1995, can be consulted.

A method for selecting good candidates for obtaining a good turbocode of dimensions K and length N1 with interlacers of the type "x to $x^e$" will now be described.

The case where N1−K=2 will be considered first of all.

An irreducible polynomial g(x) on GF(2), of degree $m \geq 2$ such that $N0=2^m-1 \geq N1$, will be chosen, and $GF(2^m)$ will be taken as the set of polynomial residues modulo g(x). n will also be chosen as an odd multiple of N0 Then a matrix Γ with 2 rows and N1 columns will then be constructed;

$$\Gamma = \begin{matrix} \alpha_1^r & \alpha_2^r & \cdots & \alpha_{N1}^r \\ \alpha_1^s & \alpha_2^s & \cdots & \alpha_{N1}^s \end{matrix}$$

where $\alpha_i$, i=1, ..., N1, are different non-nil elements of $GF(2^m)$ and r and s integers which are different modulo N0. The choice s=r+1 is for example always a good choice. This implies that everything under the matrix Γ is non-singular, Let Γ(1,2) be the sub-matrix of the first two columns of Γ, $[\Gamma(1,2)]^{-1}$ Γ will be written in the following way:

$$[\Gamma(1, 2)]^{-1}\Gamma = \begin{matrix} 1 & 0 \\ 0 & 1 \end{matrix} \Lambda$$

where Λ is a matrix 2×K on $GF(2^m)$. For a chosen value of e power of 2 modulo n, any element in the second row of Λ will be replaced by its $e^{th}$ power and the transposed matrix of this matrix will be denoted Δ. The elements of Δ will then be interpreted as polynomials of degree m−1 of indeterminate x, and will be divided by g(x) or by any other divisor polynomial of $x^{N0}+1$ and the resulting matrix will be called P(x).

Finally, the matrix G of dimension K×(K+2) will be defined by:

$$G=[I_K P(x)]$$

where $I_K$ is the identity matrix of dimension K.

For each value of e, this coder G can be used as a turbocoder. By simulation, it is then possible to choose the best value of e.

The case N1−K>2 can be treated in a similar fashion. In this case, with M1=N1−K, a matrix Γ is constructed of type M1×N1:

$$\Gamma = \begin{matrix} \alpha_1^r & \alpha_2^r & \cdots & \alpha_{N1}^r \\ \alpha_1^{r+1} & \alpha_2^{r+1} & \cdots & \alpha_{N1}^{r+1} \\ \cdots & \cdots & \cdots & \cdots \\ \alpha_1^{r+M1-1} & \alpha_2^{r+M1-1} & \cdots & \alpha_{N1}^{r+M1-1} \end{matrix}$$

With Γ(1,M1) the sub-matrix of the first M1 columns of Γ, [Γ(1,M1)]$^{-1}$ Γ as [I$_{M1}$Λ] is written or I$_{M1}$ is the identity matrix of dimension M1 and Λ a sub-matrix on GF(2$^m$) of dimension M1×K. For chosen values $e_t=2^{i_t}$, for t=2, ..., M1, the elements of the f$^{d/t}$ line of Λ are replaced by their $e_t^{th}$ power.

The transposed matrix of this matrix is then denoted Δ, the elements of Δ are interpreted as polynomials of degree m−1 of indeterminate x, they are divided by g(x) and the resulting matrix of dimensions K×(N−K) is termed P(x).

The coders G=[I$_K$ P(x)] obtained for different values of (M1−1)-tuple ($e_2$, ... $e_{M1}$) are then analysed by simulations and the best can be selected.

IIc—Description of an implementation of the second embodiment of the present invention.

Figure 7:
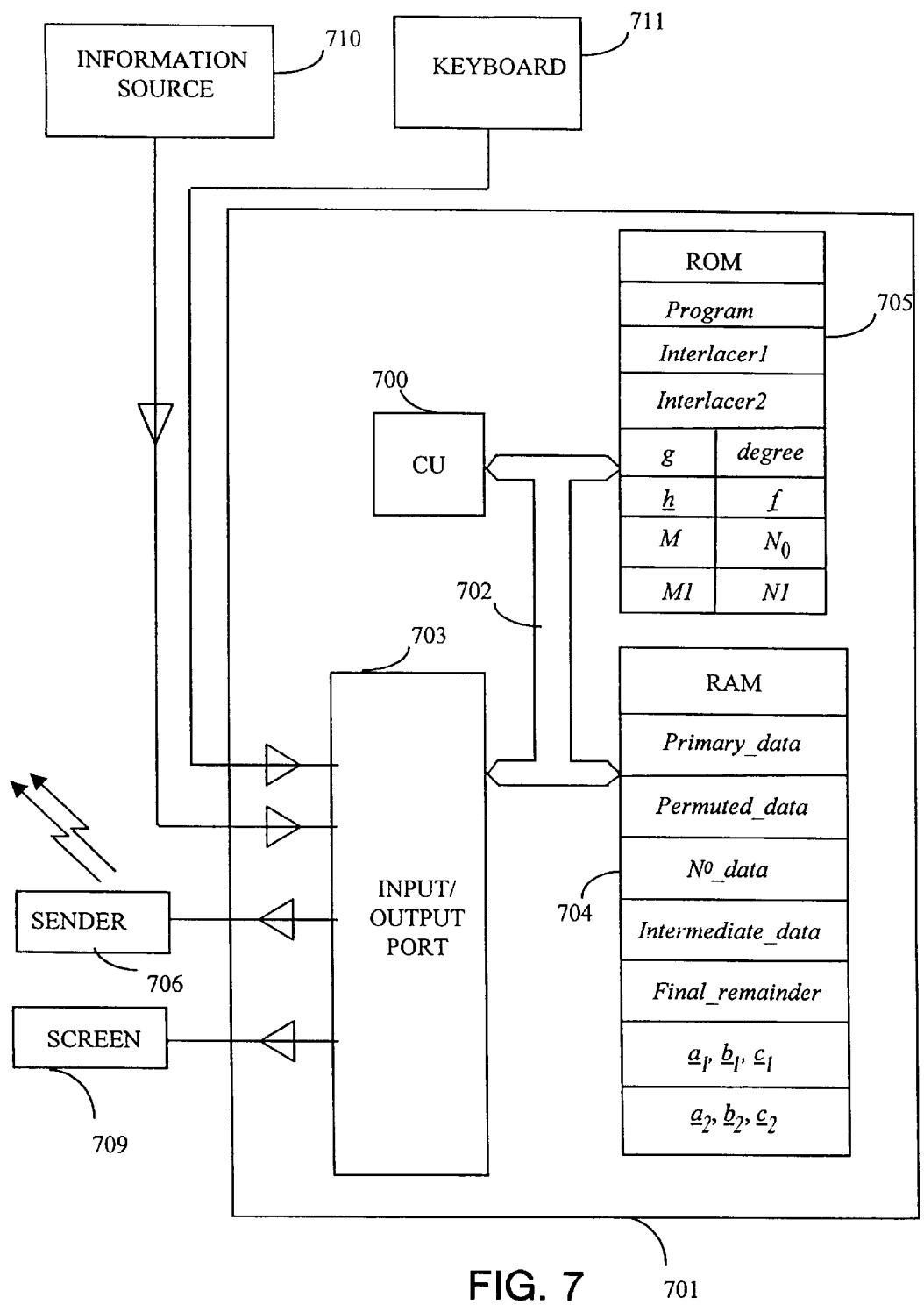
FIG. 7 depicts schematically an electronic device incorporating a coder according to a second embodiment of the present invention.
Figure 8:
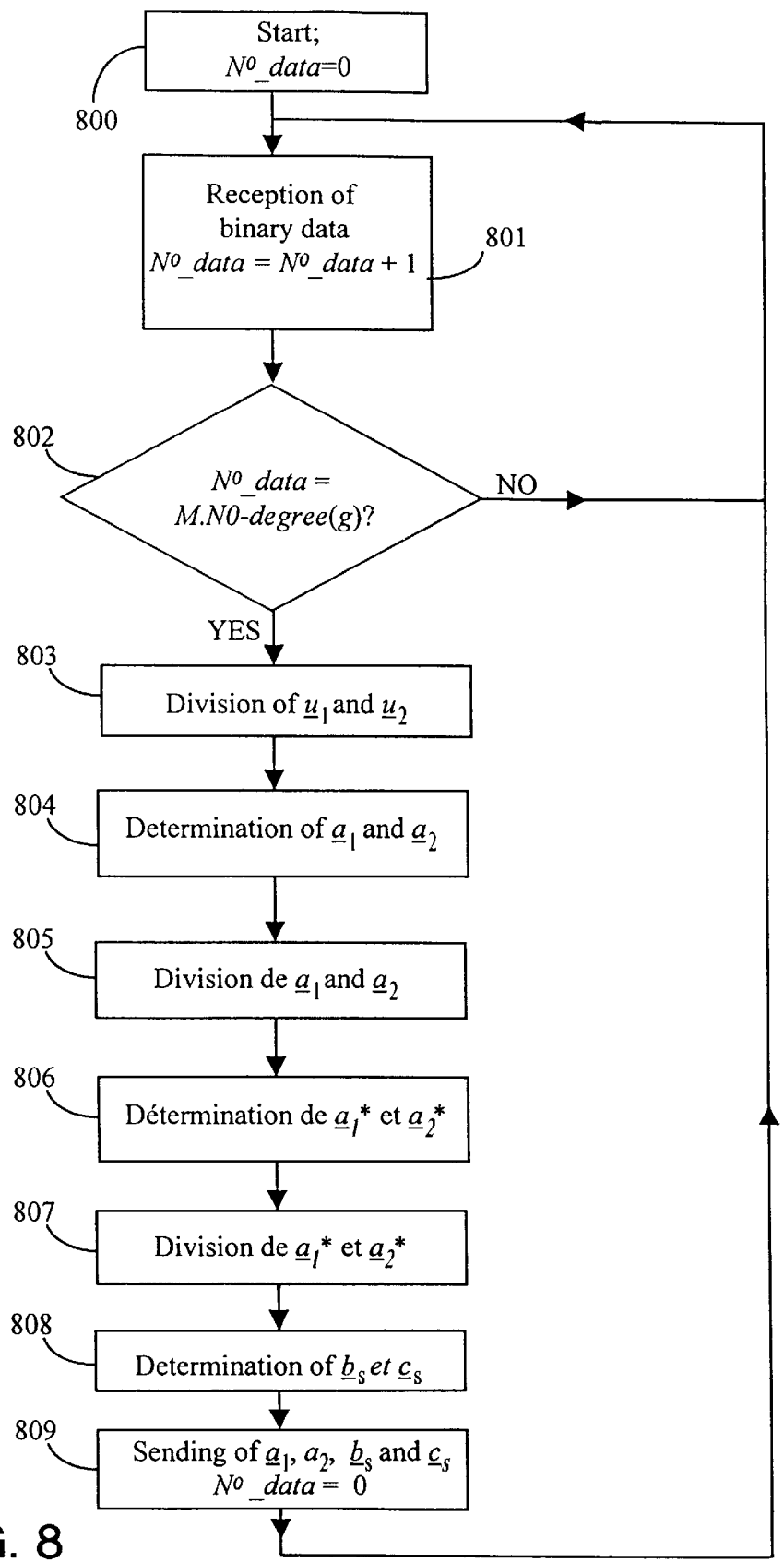
FIG. 8 depicts schematically an operating flow diagram of a coder according to the second embodiment of the present invention, as illustrated in FIG. 7.

The description of the second embodiment of the present invention will now be continued with regard to FIGS. 7 and 8, for K=M1=2.

FIG. 7 illustrates schematically the constitution of a network station or computer coding station, in the form of a block diagram. This station includes a keyboard 711, a screen 709, an external information source 710 and a radio transmitter 706, conjointly connected to an input/output port 703 of a processing card 701.

The processing card 701 has, connected together by an address and data bus 702:

a central processing unit 700;

a random access memory RAM 704;

a read only memory ROM 705; and the input/output port 703.

Each of the elements illustrated in FIG. 7 is well known to persons skilled in the art of microcomputers and transmission systems and, more generally, information processing systems. These common elements are therefore not described here. It should however be noted that:

the information source 710 is, for example, an interface peripheral, a sensor, a demodulator, an external memory or another information processing system (not shown), and is preferentially adapted to supply sequences of signals representing speech, service messages or multimedia data, in the form of sequences of binary data, the radio transmitter 706 is adapted to implement a packet transmission protocol on a nonsable channel and to transmit these packets on such a channel.

It should also be noted that the word "register" used in the description designates, in each of the memories 704 and 705, both a memory area of low capacity (a few binary data) and a memory area of large capacity enabling an entire program to be stored).

The random access memory 704 stores data, variables and intermediate processing results, in memory registers bearing, in the description, the same names as the data whose values they store. The random access memory 704 contains notably:

a register "primary_data" in which there are stored, in the order of their arrival on the bus 702, the binary data coming from the information source 710, in the form of two sequences, $\underline{u}_1$ and $\underline{u}_2$, next supplemented in order to form two sequences $\underline{a}$hd 1and $\underline{a}_2$, a register "No_data", which stores an integer number corresponding to the number of binary data n-m in the register "binary_data", a register "permuted_data" in which there are stored, in the order of their transmission on the bus 702, the permuted binary data, as described with regard to FIG. 8, in the form of two sequences, $a_1^*$ and $a_2^*$, a register "intermediate_remainder" in which there are stored successively the intermediate remainders of the divisions, a register used for constructing each sequence $a_i$ from the corresponding sequence $u_i$, a register "final_remainder" in which there are stored the complementary binary data, in the form of two sequences, and registers "$\underline{a}_1$, $b_1$, $c_1$" and "$\underline{a}_2$, $b_2$, $c_2$" in which there are stored, in the order of their determination by the central unit 700, the binary data of the sequences.

The read only memory 705 is adapted to store, in registers which, for convenience, bear the same names as the data which they store:

the operating program of the central processing unit 700, in a register "program", the sequence g, in a register"g", the degree m of g(x), in a register "degree"

the sequence h=$h_1$=$f_2$, in the register "h", the sequence f=$f_1$=$h_2$, in the register "f", the value of N0, in a register "N0", the value of N1, in a register "N1", the value of M1, in a register "M1", the value of M, in a register "M", the table defining the interlacer acting on the sequence $a_1$, in a register "interlacer1", and the table defining the interlacer acting on the sequence $a_2$, in a register "interlacer2".

The interlacers considered here are respectively of type "x to $x^{e_1}$38 and "x to $x^{e_2}$" described above.

The central processing unit 700 is adapted to implement the flow diagram described in FIG. 8.

In FIG. 8, which depicts the functioning of a coder as illustrated in FIG. 7, it can be seen that, after an initialisation operation 800, during which the registers of the random access memory 704 are initialised (No_data="0"), during an operation 801, the central unit 700 waits until it receives, and then receives a binary data item to be transmitted, positions it in the random access memory 704, in the register "primary_data" and increments the counter "No_data".

It should be noted here that, in order to constitute the two sequences $\underline{u}_1$ and $\underline{u}_2$, the central unit 700 first of all constitutes the sequence $\underline{u}_1$ and then the sequence $\underline{u}_2$, with the primary data coming from the information source 710.

Next, during a test 802, the central unit 700 determines whether or not the integer number stored in the register "No_data" is equal to the product M.N0 from which the degree m of g(x), is subtracted M, N0 and the degree m of g(x) being values stored in the random access memory 705.

When the result of the test 802 is negative, the operation 801 is reiterated. When the result of the test 802 is positive, during an operation 803, the divisions of the polynomials $u_1(x)$ and $u_2(x)$ respectively associated with the sequences of binary data $\underline{u}_1$ and $\underline{u}_2$ stored in the register "primary_data", by the polynomial g(x), are effected, up to the last terms (of the highest degrees) of $u_1(x)$ and $u_2(x)$, using, for this purpose the register "intermediate_remainder". The remainders of these divisions are stored in memory in the register "final_remainder". The results of these divisions supply the first elements of the sequences $b_1=\underline{a}_1/g$ and $b_2=\underline{a}_2/g$.

Next, during an operation 804, the binary data stored in the register "final_remainder are respectively juxtaposed with the ends of the sequences $\underline{u}_1$ and $\underline{u}_2$ in order to form the sequences $\underline{a}_1$ and $\underline{a}_2$. The binary data of the sequences $\underline{a}_1$ and $\underline{a}_2$ are stored in memory in the registers "$\underline{a}_1, b_1, c_1$" and "$\underline{a}_2, b_2, c_2$".

Next, during an operation 805, the divisions effected during the operation 803 are continued, with the additional data added during the operation 804, and the sequences $b_1$ and $b_2$ are completed in the register $\underline{a}_1, b_1, c_1$," and "$\underline{a}_2, b_2, c_2$".

Then, during an operation 806:
the binary data of the sequence $\underline{a}_1$ are respectively and successively read in the register "$\underline{a}_1, b_1, c_1$", in the order described by the table "interlacer1" stored in the random access memory 705, and
the binary data of the sequence $\underline{a}_2$ are respectively and successively read in the register "$\underline{a}_2, b_2, c_2$", in the order described by the table "interlacer2" stored in the random access memory 705.

The data which results successively from these readings are respectively stored in memory in the register "permuted_data" of the random access memory 704.

Next, during an operation 807, the divisions of the polynomials $a_1^*(x)$ and $a_2^*(x)$, respectively associated with the sequences of permuted binary data stored in the register "permuted_data", by the polynomial $g(x)$ are effected, using for this purpose the register "intermediate_remainder". The results of these divisions are stored in memory in the register $\underline{a}_1, b_1, c_1$" and "$\underline{a}_2, b_2, c_2$", and correspond to the binary data of the sequences $c_1$ and $c_2$.

During an operation 808, two so-called "check" or "redundant" sequences are determined:
the sequence $b_s$ is determined by effecting the product of the polynomials associated with the sequences $b_1$ and $b_2$ stored in the registers "$\underline{a}_1, b_1, c_1$" and "$\underline{a}_2, b_2, c_2$" in the random access memory 704 and respectively the polynomials $h(x)$ and $f(x)$;
the sequence $c_s$ is determined by effecting the product of the polynomials associated with the sequences $c_1$ and $C_2$ stored in the registers "$\underline{a}_1, b_1, c_1$" and "$\underline{a}_2, b_2, c_2$" in the random access memory 704 and respectively the polynomials $f(x)$ and $h(x)$.

It should be noted that, by virtue of the invention, memory elements are saved by effecting the division by $g(x)$ before the multiplications by $h(x)$ or $f(x)$.

During an operation 809, the sequences $\underline{a}_1, \underline{a}_2, b_s$ and $c_s$ are transmitted, using for this purpose the transmitter 706. Next the registers of the memory 704 are once again initialised, in particular the counter No_data is reset to "0" and the operation 801 is reiterated.

It should be noted here that, as a variant, during the operation 809, the sequences $\underline{a}_1$ and $\underline{a}_2$ are sent as a whole, but only a subset, for example one data item out of two, of each of the sequences $b_s$ and $c_s$ is sent. This variant is known to persons skilled in the art as puncturing.

With regard to decoding, it should be noted that, knowing the polynomials $g(x), h(x), f(x)$ and the interlacers $G_1$ and $G_2$ which, from sequences $\underline{a}_1$ and $\underline{a}_2$ respectively supply the permuted sequences $a_1^*$ and $a_2^*$, a person skilled in the art knows, without any technical problem, how to produce the decoder and adapted to the decoding and error correction affecting the quadruplet of sequences ($\underline{a}_1, \underline{a}_2, b_s, c_s$) using the interlacers considered above and, possibly, the corresponding deinterlacers.

Figure 9:
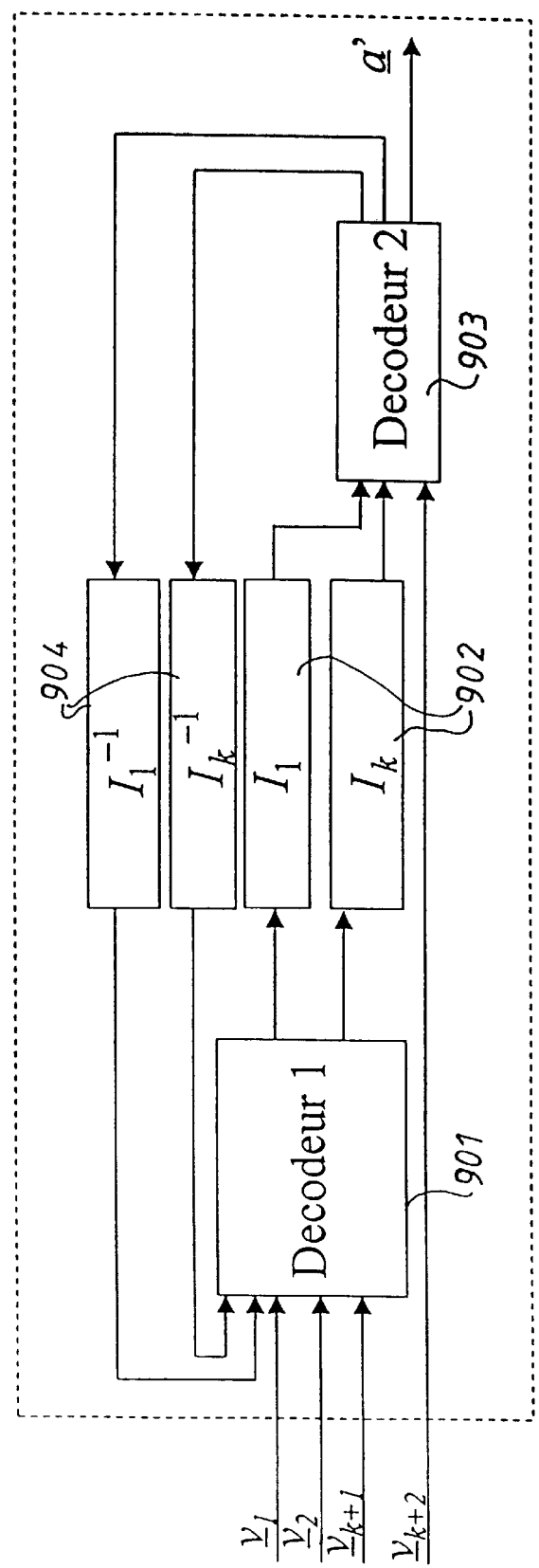
FIG. 9 depicts schematically a decoding device to which the present invention relates.

In FIG. 9, it can be seen that a decoding device adapted to decode the sequences sent by the decoding device illustrated in FIGS. 4 to 8, has, essentially:
a decoder 901 corresponding to the coder 401, which receives the estimations of transmitted sequences, $v_1$ to $v_{K+1}$ as well as K extrinsic information sequences $w'''_1$ to $w'''_K$ disclosed below, and supplies K estimation sequences a posteriori $w_1$ to $w_K$,
K interlacers 902, identical to the interlacers 402 to 405 used in the coder, which receive respectively the sequences $w_1$ to $w_K$ and interlace then respectively as $w'_1$ to $w'_K$,
a second decoder 903, corresponding to the coder 406 receiving the sequences $w'_1$ to $w'_K$ as well as the sequence $v_{K+2}$ and supplies on the one hand K a posteriori estimation sequences $w''_1$ to $w''_K$ and on the other hand an estimated sequence a', and
K deinterlacers 904, the reverse of the interlacers 402, to 405, receiving the sequences $w''_1$ to $w''_K$ and supplying the sequences $w'''_1$ to $w'''_K$.

The estimated sequence a' is taken into account only following a predetermined number of iterations (see the article "Near Shannon limit error-correcting coding and decoding: turbocodes" cited above).

In accordance with the present invention, the interlacers and deinterlacers used for decoding each have the same characteristics as the interlacers used for coding and preferentially, or of the type "x to $x^e$". Preferentially, for coding as for decoding, for an identical value of j the exponents $e_{ij}$ are equal. Also preferentially, for coding as for decoding, the value of the exponents $e_{ij}$ are all powers of 2.

In addition, in initialising the decoders 901 and 903, account is taken of the fact that the coders 401 and 406 each have an initial state and a final nil state.

Concerning decoding, the reader can refer:
to the article by Messrs L. R. BAHL, J. COCKE, F. JELINEK and J. RAVIV entitled "Optimal decoding of linear codes for minimizing symbol error rate", published in the journal IEEE Transactions on Information Theory, in March 1974;
to the article by Messrs J. HAGENAUER, E. OFFER and L. PAPKE entitled "Iterative decoding of binary block and convolutional codes" published in the journal IEEE Transactions on Information Theory, in March 1996;
to the article by Messrs J. HAGENAUER and P. HOEHER entitled "A Viterbi algorithm with soft decision outputs and its applications", published with the reports of the conference IEEE GLOBECOM, pages 1680–1686, in November 1989;
to the article Messrs J. HAGENAUER, P. ROBERTSON and L. PAPKE entitled "Iterative (turbo)decoding of systematic convolutional codes with the MAP and SOVA algorithms", published by the journal Informationstechnische Gesellschaft (ITG) Fachbericht, pages 21–29, October 1994; and
to the article by Messrs C. BERROU, S. EVAN0 and G. BATTAIL, entitled "turbo-block-codes" and published with the reports of the seminar "Turbo Coding" organised by the institute of technology of Lünd (Sweden) (Department of Applied Electronics) in August 1996.

What is claimed is:

1. A coding method for the transmission of information representing a physical quantity in which, a set of K polynomials $g_i(x)$ (i=1, . . . , K), where K is a strictly positive integer, with binary coefficients of degree m and with a constant term equal to 1 having been predetermined, first of all said information is presented in the form of K binary sequences $\underline{u}_i$ (i=1, ..., K), of length (n−m), where n is the product of a predetermined strictly positive integer M by the integer N0 which is the smallest integer such that the polynomial ($x^{N0}$+1) is divisible by all said polynomials $g_i(x)$, and then there is produced a set of (K+M1) binary sequences $\underline{a}_i$ (i=1, ..., K) and $c_j$ (j=1, ..., M1), where M1 is an integer larger than 1, each of length n, intended to be transmitted and obtained as follows:

one extends each sequence $\underline{u}_i$ by means of m "padding" bits to compute a sequence $\underline{a}_i$ such that the polynomial $\underline{a}_i(x)$ associated with $\underline{a}_i$ is respectively divisible by $g_i(x)$, one generates sequences $c_j$ represented by the polynomials $$c_j(x) = \sum_{i=0}^{K} a_{ij}^*(x) f_{ij}(x) / g_{ij}(x),$$

where the $g_{ij}(x)$ are predetermined polynomials which can be respectively equal to the polynomials $g_i(x)$, the $f_{ij}(x)$ are predetermined polynomials having a degree at most equal to the degree of the respective polynomial $g_{ij}(x)$, and the $a_{ij}^*(x)$ are K·M1 polynomials representing binary sequences $\underline{a}_{ij}^*$ each obtained by means of a predetermined permutation of the respective sequence $\underline{a}_i$, wherein at least one permuted sequence $\underline{a}_{ij}^*$ is different from the corresponding sequence $\underline{a}_i$, and said permutations are chosen among the set of permutations which, in a representation where the binary data of each sequence $a_i$ are written, row by row, in a table with N0 columns and M rows, are the resultant of any number of so-called elementary permutations each of which:

either has the property of transforming the cyclic code of length N0 and with a generator polynomial $g_i(x)$ into an equivalent cyclic code with a generator polynomial $g_{ij}(x)$, and acts by permutation on the N0 columns of the table representing $\underline{a}_i$, or is any permutation of the symbols of a column of said table, which results in the fact that each polynomial $a_{ij}^*(x)$ is divisible by the respective polynomial $g_{ij}(x)$.

2. The coding method according to claim 1, wherein said generator polynomials $g_i(x)$ have no multiple polynomial factors, said permutations are chosen to be specifically of the form:

$$a_{ij}^*(x) = a_i^*(x^{eij}) \text{ modulo } (x^n+1),$$

where the numbers $e_{ij}$ are predetermined integers relatively prime with n, and each said polynomial $g_{ij}(x)$ is the generator polynomial of the smallest cyclic code of length N0 containing the respective polynomial $g_i(x^{eij})$ modulo ($x^{N0}$+1).

3. The coding method according to claim 2, wherein all the values of the exponents $e_{ij}$ having the same value of the index j are identical.

4. The coding method according to any one of claims 1 to 3, wherein said method includes an operation of transmitting on the one hand sequences $\underline{a}_i$, and, on the other hand, a sub-set only of data of the other sequences.

5. A turbodecoding method, characterized in that it makes it possible to decode received binary sequences which have been transmitted after having been coded by means of a coding method according to any one of claims 1 to 3.

6. A turbodecoding device, characterized in that it includes a processing means which makes it possible to implement a turbodecoding method according to claim 5.

7. The coding method according to claim 2 or 3, wherein all the values of the exponents $e_{ij}$ are equal to a power of 2.

8. The coding method according to claim 7, wherein all said polynomials $g_{ij}(x)$ are identical, and that the polynomials $f_{ij}(x)$ are chosen so that, within each set of (K+M1) binary sequences produced, at least (M1+1) are non-nil.

9. A coding device for the transmission of information representing a physical quantity, including a processing means which, a set of K polynomials $g_i(x)$ (i=1, ..., K), where K is a strictly positive integer, with binary coefficients of degree m and with a constant term equal to 1 having been predetermined, is adapted to first of all present said information in the form of K binary sequences $\underline{u}_i$ (i=1; ..., K), of length (n−m), where n is the product of a predetermined strictly positive integer M by the integer N0 which is the smallest integer such that the polynomial ($x^{N0}$+1) is divisible by all said polynomials $g_i(x)$, and then to produce a set of (K+M1) binary sequences $\underline{a}_i$; (i=1, ..., K) and $c_j$ (j=1, ..., M1), where M1 is an integer larger than 1, each of length n, intended to be transmitted and obtained as follows:

each sequence $\underline{u}_i$ is extended by means of m "padding" bits to yield a sequence $\underline{a}_i$ such that the polynomial $a_i(x)$ associated with $a_i$ is respectively divisible by $g_i(x)$, sequences $c_j$ represented by the polynomials $$c_j(x) = \sum_{i=0}^{K} a_{ij}^*(x) f_{ij}(x) / g_{ij}(x)$$

are generated, where the $g_{ij}(x)$ are predetermined polynomials which can be respectively equal to the polynomials $g_i(x)$, the $f_{ij}(x)$ are predetermined polynomials having a degree at most equal to the degree of the respective polynomial $g_{ij}(x)$, and the $a_{ij}^*(x)$ are K·M1 polynomials representing binary sequences $\underline{a}_{ij}^*$ each obtained by means of a predetermined permutation of the respective sequence $\underline{a}_i$ effected by an interlacer, said interlacer being characterized in that at least one permuted sequence $\underline{a}_{ij}^*$ is different from the corresponding sequence $\underline{a}_i$, and in that said permutations belong to the set of permutations which, in a representation where the binary data of each sequence $\underline{a}_i$ are written, row by row, in a table with N0 columns and M rows, are the resultant of any number of so-called elementary permutations each of which:

either has the property of transforming the cyclic code of length N0 and with a generator polynomial $g_i(x)$ into an equivalent cyclic code, with a generator polynomial $g_{ij}(x)$, and acts by permutation on the N0 columns of the table representing $\underline{a}_i$, or is any permutation of the symbols of a column of said table, which results in the fact that each polynomial $a_{ij}^*(x)$ is divisible by the respective polynomial $g_{ij}(x)$.

10. The coding device according to claim 9, wherein said generator polynomials $g_i(x)$ have no multiple polynomial factors, in that said permutations are specifically of the form:

$$a_{ij}^*(x) = a_i^*(x^{eij}) \text{ modulo } (x^n+1),$$

where the numbers $e_{ij}$ are predetermined integers relatively prime with n, and in that each said polynomial $g_{ij}(x)$ is the generator polynomial of the smallest cyclic code of length N0 containing the respective polynomial $g_i(x^{eij})$ modulo ($x^{N0}$+1).

11. The coding device according to claim 10, wherein said processing means is adapted to use exponents $e_{ij}$ which, when they have the same value of the index j, are identical.

12. The coding device according to claim 10 or 11, wherein said processing means is adapted to use exponents $e_{ij}$ which each have a value equal to a power of 2.

13. The coding device according to claim 12, wherein said processing means is adapted to use polynomials $g_{ij}(x)$ which are all identical, and polynomials $f_{ij}(x)$ which have been chosen so that, within each set of (K+M1) binary sequences produced by said coding device, at least (M1+1) are non-nil.

14. The coding device according to any one of claims 9 to 11, wherein said coding device has a transmission means adapted to transmit on the one hand the sequences $\underline{a}_i$, and, on the other hand, a sub-set only of the data of the other sequences.

15. A coding device comprising:
   a converter adapted to convert a first binary sequence corresponding to a polynomial u(x) to a second binary sequence corresponding to a polynomial a(x) divisible by a predetermined polynomial g(x);
   a first coder adapted to code the second binary sequence to output a third binary sequence corresponding to a polynomial b(x);
   an interleaver adapted to permute the second binary sequence to generate a fourth binary sequence corresponding to a polynomial a*(x) divisible by a polynomial g(x); and
   a second coder adapted to code the fourth binary sequence to output a fifth binary sequence corresponding to a polynomial c(x).

16. The coding device according to claim 15, wherein a length of the first sequence is equal to a product of a positive integer M by an integer N0 minus a degree of the polynomial g(x), where the integer N0 is the smallest integer such that a polynomial $(x^{N0}+1)$ is divisible by the polynomial g(x).

17. The coding device according to claim 15, wherein said first coder and said second coder are elementary recursive convolutional coders.

18. The coding device according to claim 15, wherein said coding device is applicable to a radio communication system.

19. A coding method comprising steps of:
   converting a first binary sequence corresponding to a polynomial u(x) to a second binary sequence corresponding to a polynomial a(x) divisible by a predetermined polynomial g(x);
   coding the second binary sequence to output a third binary sequence corresponding to a polynomial b(x);
   permuting the second binary sequence to generate a fourth binary sequence corresponding to a polynomial a*(x) divisible by a polynomial g(x); and
   coding the fourth binary sequence to output a fifth binary sequence corresponding to a polynomial c(x).

20. The coding method according to claim 19, wherein a length of the first sequence is equal to a product of a positive integer M by an integer N0 minus a degree of the polynomial g(x), where the integer N0 is the smallest integer such that a polynomial $(x^{N0}+1)$ is divisible by the polynomial g(x).

21. The coding method according to claim 19, wherein the second binary sequence and the fourth binary sequence are coded by elementary recursive convolutional coders.

22. The coding method according to claim 19, wherein said coding method is applicable to a radio communication system.

* * * * *

UNITED STATES PATENT AND TRADEMARK OFFICE
CERTIFICATE OF CORRECTION

PATENT NO. : 6,370,670 B1
APPLICATION NO. : 09/222849
DATED : April 9, 2002
INVENTOR(S) : Claude Le Dantec et al.

It is certified that error appears in the above-identified patent and that said Letters Patent is hereby corrected as shown below:

SHEET 2

Figure 2, "de" (all occurrences) should read --of--.

SHEET 3

Figure 3, "Détermination de N0" should read --Determination of N0--.

SHEET 9

Figure 9, "Decodeur" (both occurrences) should read --Decoder--.

COLUMN 1

Line 27, "a" should read --to--.

COLUMN 2

Line 67, "et" should read --and--.

COLUMN 3

Line 37, "a(f)" should read --a(x)--.

COLUMN 5

Line 23, "1992)." should read --1992.--.

UNITED STATES PATENT AND TRADEMARK OFFICE
CERTIFICATE OF CORRECTION

PATENT NO. : 6,370,670 B1
APPLICATION NO. : 09/222849
DATED : April 9, 2002
INVENTOR(S) : Claude Le Dantec et al.

It is certified that error appears in the above-identified patent and that said Letters Patent is hereby corrected as shown below:

COLUMN 6

Line 36, "$a_i(j=1$," should read --$a_i(i=1$--.

COLUMN 7

Line 10, "(j=1," should read --(i=1,--;
Line 20, "(j=1 ," should read --(i=1 ,--;
Line 41, "(j=1," should read --(i=1,--; and
Line 42, "$a_j$," should read --$a_i$--.

COLUMN 8

Line 4, "(j=1," should read --(i=1,--; and
Line 66, "(j=1 ," should read --(i=1,--.

COLUMN 14

Line 55, "wafts" should read --waits--.

COLUMN 16

Line 7, "EVAN0" should read --EVANO--.

COLUMN 18

Line 25, "n-mn" should read --n-m--.

UNITED STATES PATENT AND TRADEMARK OFFICE
CERTIFICATE OF CORRECTION

| | | |
|---|---|---|
| PATENT NO. | : 6,370,670 B1 | |
| APPLICATION NO. | : 09/222849 | |
| DATED | : April 9, 2002 | |
| INVENTOR(S) | : Claude Le Dantec et al. | |

It is certified that error appears in the above-identified patent and that said Letters Patent is hereby corrected as shown below:

COLUMN 22

Line 18, "module" should read --modulo--; and
Line 33, "N0" should read --N0.--.

COLUMN 23

Line 54, "nonsable" should read --non-cable--.

COLUMN 24

Line 3, "ahd 1" should read --$a_1$--; and
Line 42, "$x^{el}$ 38" should read --$x^{el}$--.

COLUMN 25

Line 26, "results" should read --result--; and
Line 46, "$C_2$" should read --$c_2$--.

UNITED STATES PATENT AND TRADEMARK OFFICE
CERTIFICATE OF CORRECTION

| | |
|---|---|
| PATENT NO. | : 6,370,670 B1 |
| APPLICATION NO. | : 09/222849 |
| DATED | : April 9, 2002 |
| INVENTOR(S) | : Claude Le Dantec et al. |

It is certified that error appears in the above-identified patent and that said Letters Patent is hereby corrected as shown below:

COLUMN 26

Line 59, "EVAN0" should read --EVANO--.

Signed and Sealed this

Twenty-eighth Day of November, 2006

JON W. DUDAS
*Director of the United States Patent and Trademark Office*